(12) United States Patent
Jung et al.

(10) Patent No.: US 11,302,815 B2
(45) Date of Patent: Apr. 12, 2022

(54) SEMICONDUCTOR DEVICE INCLUDING ACTIVE REGION AND GATE STRUCTURE

(71) Applicant: SAMSUNG ELECTRONICS CO., LTD., Suwon-si (KR)

(72) Inventors: Joohee Jung, Seoul (KR); Jinbum Kim, Seoul (KR); Dongil Bae, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 16/866,628

(22) Filed: May 5, 2020

(65) Prior Publication Data
US 2021/0043763 A1 Feb. 11, 2021

(30) Foreign Application Priority Data
Aug. 5, 2019 (KR) .......... 10-2019-0094901

(51) Int. Cl.
*H01L 29/78* (2006.01)
*H01L 29/66* (2006.01)
*H01L 29/417* (2006.01)
*H01L 29/06* (2006.01)
*H01L 27/088* (2006.01)

(52) U.S. Cl.
CPC ........ *H01L 29/785* (2013.01); *H01L 27/0886* (2013.01); *H01L 29/0649* (2013.01); *H01L 29/41791* (2013.01); *H01L 29/66795* (2013.01); *H01L 2029/7858* (2013.01)

(58) Field of Classification Search
CPC .......... H01L 29/785; H01L 27/0886
See application file for complete search history.

(56) References Cited

U.S. PATENT DOCUMENTS

| | | | |
|---|---|---|---|
| 7,288,802 B2 | 10/2007 | Anderson et al. | |
| 8,154,082 B2 | 4/2012 | Moriyama et al. | |
| 9,257,450 B2 | 2/2016 | Loubet et al. | |
| 9,406,782 B2 | 8/2016 | Yu et al. | |
| 9,660,033 B1 | 5/2017 | Chen et al. | |
| 9,853,101 B2 | 12/2017 | Peng et al. | |
| 10,008,583 B1 | 6/2018 | Rodder et al. | |
| 2019/0279911 A1* | 9/2019 | Cheng | H01L 21/823814 |
| 2020/0365703 A1* | 11/2020 | Chung | H01L 29/66545 |

* cited by examiner

*Primary Examiner* — Farun Lu
(74) *Attorney, Agent, or Firm* — Lee IP Law, P.C.

(57) ABSTRACT

A semiconductor device includes an active region extending from a substrate in a vertical direction, source/drain regions spaced apart from each other on the active region, a fin structure between the source/drain regions on the active region, the fin structure including a lower semiconductor region on the active region, a stack structure having alternating first and second semiconductor layers on the lower semiconductor region, a side surface of at least one of the first semiconductor layers being recessed, and a semiconductor capping layer on the stack structure, an isolation layer covering a side surface of the active region, a gate structure overlapping the fin structure and covering upper and side surfaces of the fin structure, the semiconductor capping layer being between the gate structure and each of the lower semiconductor region and stack structure, and contact plugs electrically connected to the source/drain regions.

14 Claims, 22 Drawing Sheets

SEMICONDUCTOR DEVICE INCLUDING ACTIVE REGION AND GATE STRUCTURE

CROSS-REFERENCE TO RELATED APPLICATION

Korean Patent Application No. 10-2019-0094901, filed on Aug. 5, 2019, in the Korean Intellectual Property Office, and entitled: "Semiconductor Device Including Active Region and Gate Structure," is incorporated by reference herein in its entirety.

BACKGROUND

1. Field

The present disclosure relates to semiconductor devices, and more particularly, to a semiconductor device having an active region and a gate structure.

2. Description of the Related Art

As demand for high performance, high speed and/or multifunctionality in semiconductor devices is increased, the degree of integration of semiconductor devices is increasing. In order to address the limitations of operating characteristics caused by a reduction in size of a planar MOSFET, various efforts are underway to develop a MOSFET including a channel having a three-dimensional structure.

SUMMARY

According to an example embodiment, a semiconductor device includes a first active region extending from a semiconductor substrate in a vertical direction, the first active region extending in a first direction, parallel to an upper surface of the semiconductor substrate, first source/drain regions spaced apart from each other in the first direction on the first active region, a fin structure between the first source/drain regions on the first active region, the fin structure having a first lower semiconductor region extending from the first active region, a stack structure on the first lower semiconductor region, the stack structure including alternating first and second semiconductor layers stacked in the vertical direction, and a side surface of at least one first semiconductor layer of the alternating first and second semiconductor layers being recessed in a second direction perpendicular to the first direction, and a semiconductor capping layer on the stack structure, a first isolation layer covering a side surface of the first active region on the semiconductor substrate, a first gate structure overlapping the fin structure and extending in the second direction to cover an upper surface of the fin structure and side surfaces of the fin structure in the second direction, the semiconductor capping layer being between the first gate structure and the stack structure and between the first gate structure and the first lower semiconductor region, and first contact plugs electrically connected to the first source/drain regions.

According to an example embodiment, a semiconductor device includes an isolation layer defining an active region on a semiconductor substrate, source/drain regions on the active region, a fin structure extending from the active region in a vertical direction, perpendicular to an upper surface of the semiconductor substrate, and disposed between the source/drain regions, and a gate structure overlapping the fin structure and extending upwardly of the isolation layer. The active region extends in a first direction, parallel to the upper surface of the semiconductor substrate. The source/drain regions are in contact with side surfaces of the fin structure in the first direction. The gate structure covers side surface of the fin structure in a second direction and an upper surface of the fin structure. The second direction is perpendicular to the first direction. The fin structure includes a lower semiconductor region extending from the active region in the vertical direction, a stack structure on the lower semiconductor region, and a portion between at least the gate structure and the stack structure. The stack structure includes a plurality first semiconductor layers and a plurality of second semiconductor layers, alternately stacked in the vertical direction. Among side surfaces of the fin structure, at least one side surface overlaps a portion of the isolation layer.

According to an example embodiment, a semiconductor device includes a shallow isolation layer defining a plurality of active regions on a semiconductor substrate, source/drain regions on the plurality of active regions, fin structures extending from the plurality of active regions in a vertical direction, perpendicular to an upper surface of the semiconductor substrate and disposed to be in contact with the source/drain regions, and a gate structure overlapping the fin structure and extending upwardly of the shallow isolation layer. Each of the plurality of active regions extends in a first direction, parallel to the upper surface of the semiconductor substrate. The source/drain regions are in contact with side surfaces of the fin structure in the first direction. The gate structure covers side surfaces of the fin structures in a second direction and upper surface of the fin structures. The second direction is perpendicular to the first direction. Each of the fin structures includes a lower semiconductor region extending from the active regions in the vertical direction, a stack structure on the lower semiconductor region, and a semiconductor capping layer covering side surfaces of the stack structure in the second direction. The stack structure includes a plurality of first semiconductor layers and a plurality of second semiconductor layers, alternately stacked in the vertical direction. The plurality of second semiconductor layers include a material different from a material of the plurality of first semiconductor layers. Side surfaces of the plurality of first semiconductor layers in the second direction are concave further than side surfaces of the plurality of second semiconductor layers in the second direction. In at least one of the plurality of first semiconductor layers, a width of a central portion in the second direction is less than a width of each of an upper surface and a lower surface in the second direction.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
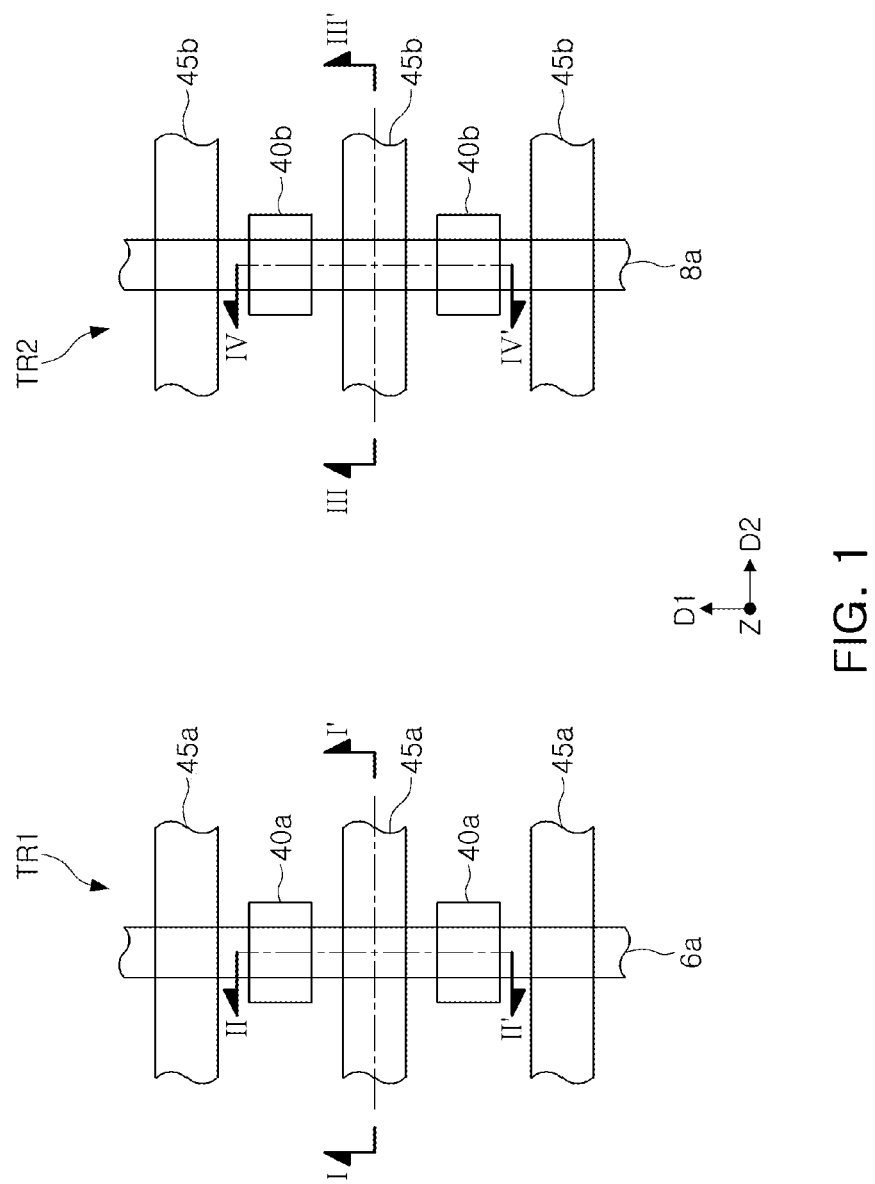
FIG. 1 illustrates a plan view of a semiconductor device according to example embodiments.

An example of a semiconductor device according to an example embodiment will be described with reference to FIGS. 1, 2A, and 2B. FIG. 1 is a plan view of a semiconductor device according to example embodiments, FIG. 2A is a cross-sectional view, taken along lines I-I' and II-II' in FIG. 1, illustrating an example of a semiconductor device according to an example embodiment, and FIG. 2B is a cross-sectional view, taken along lines III-III' and IV-IV' in FIG. 1, illustrating an example of a semiconductor device according to an example embodiment.

Figure 2A:
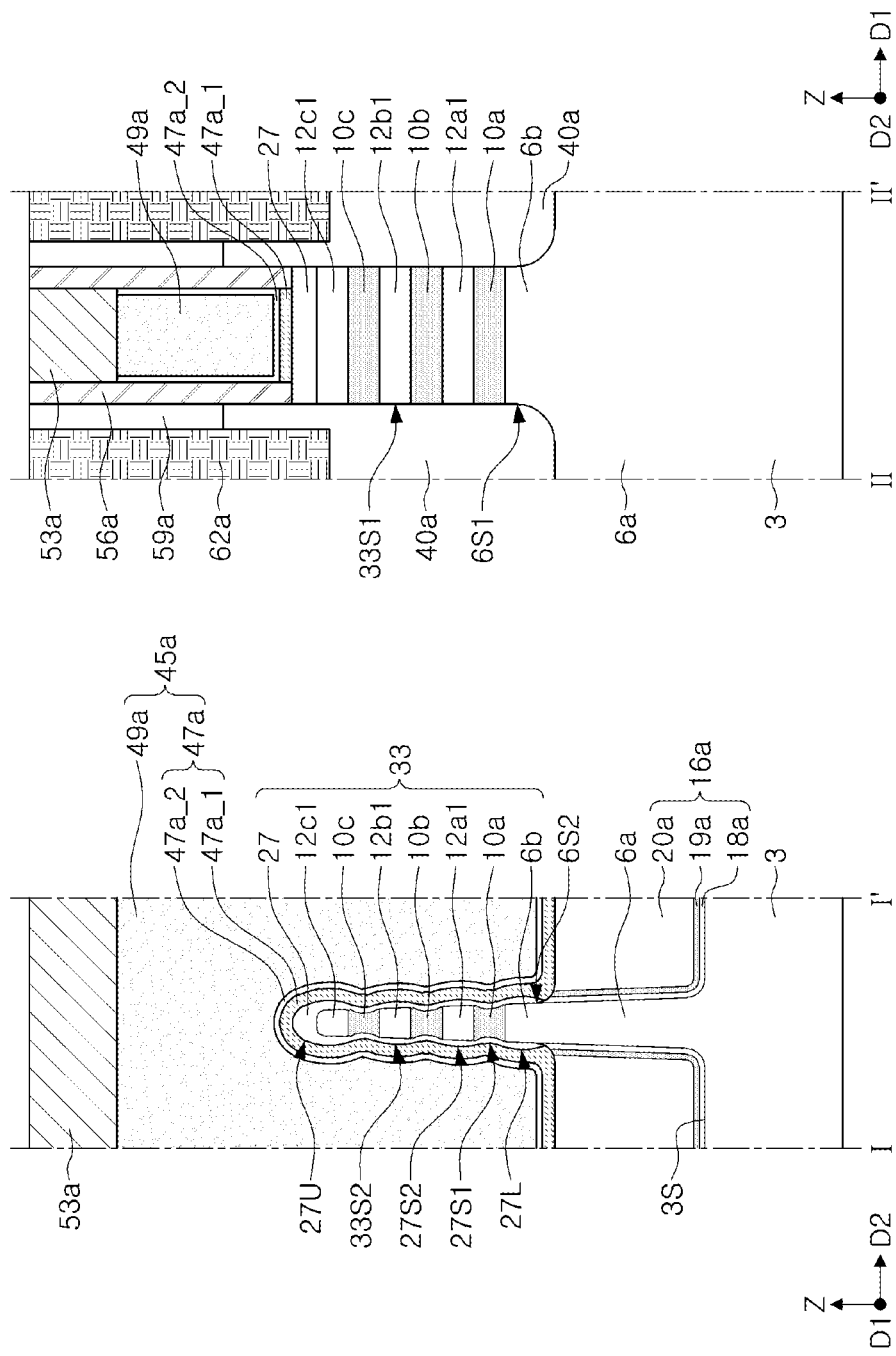
FIGS. 2A and 2B illustrate cross-sectional views according to an example embodiment.
Figure 2B:
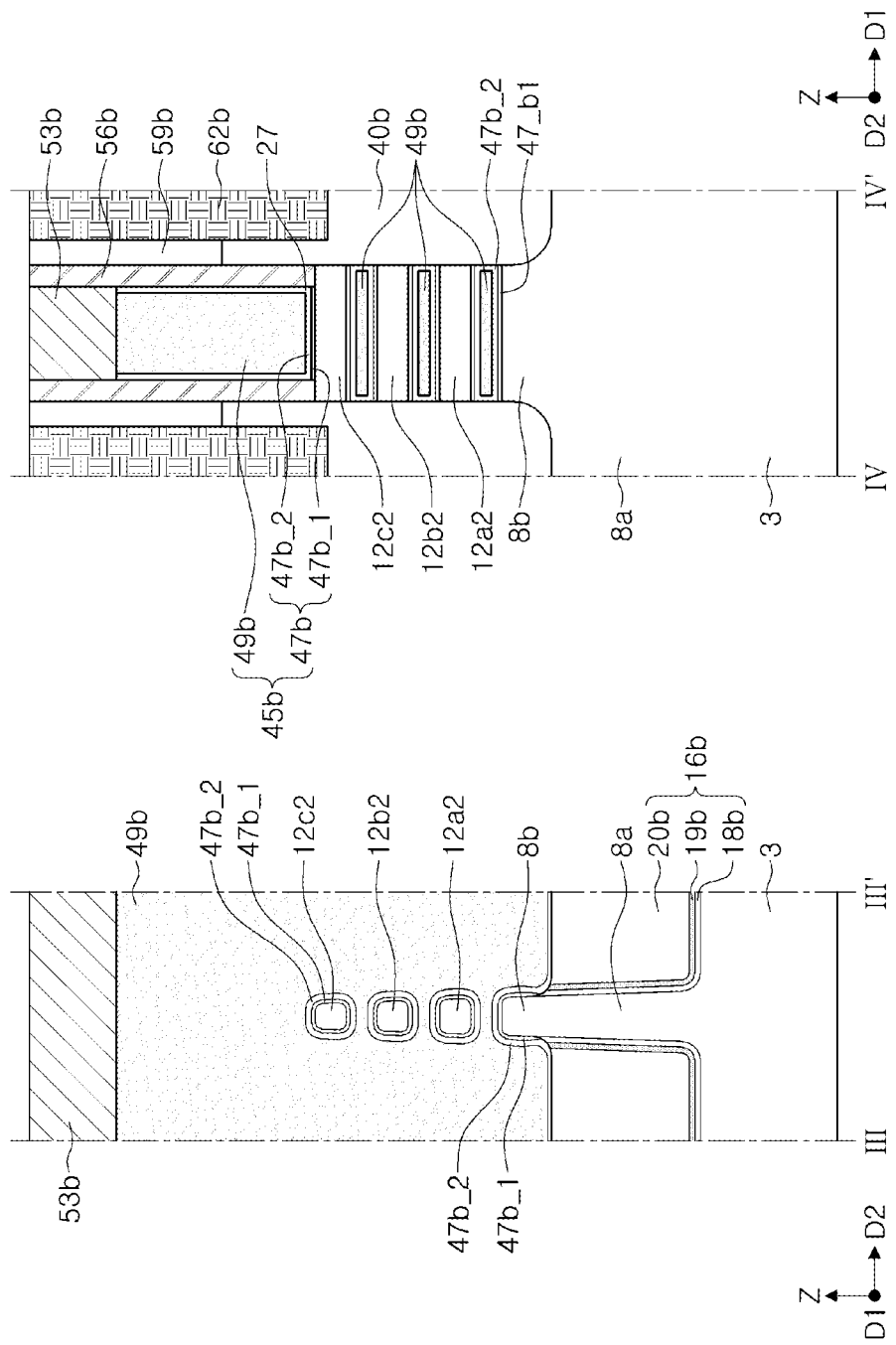

Referring to FIGS. 1 and 2A, a first active region 6a protruding from a semiconductor substrate 3 in a vertical direction Z and extending in a first direction D1, a fin structure 33 on the first active region 6a, a first gate structure 45a overlapping the fin structure 33, and first source/drain regions 40a on the first active region 6a may be disposed in a first transistor region TR1. The fin structure 33 may include a first lower semiconductor region 6b, stack structures 10a, 10b, 10c, 12a1, 12b1, and 12c1, and a semiconductor capping layer 27.

The semiconductor substrate 3 may be, e.g., a silicon substrate. The vertical direction Z may be a direction perpendicular to an upper surface 3S of the semiconductor substrate 3. The first active region 6a may extend in the first direction D1 parallel to the upper surface 3S of the semiconductor substrate 3.

A first isolation layer 16a may be disposed on the semiconductor substrate 3 to cover side surfaces of the first active region 6a. The first isolation layer 16a may include a first buffer insulating layer 18a covering the upper surface 3S of the semiconductor substrate 3 and side surfaces of the first active region 6a, a first insulating liner 19a covering the first buffer insulating layer 18a, and a first gap-fill insulating layer 20a covering the first insulating liner 19a.

The fin structure 33 may have first side surfaces 33S1 in the first direction D1 and second side surfaces 33S2 in a second direction D2 perpendicular to the first direction D1.

The second direction D2 may be parallel to the upper surface 3S of the semiconductor substrate 3.

Throughout the specification, "the side surfaces in the first direction D1" may refer to side surfaces arranged in the first direction D1, and "the side surfaces in the second direction D2" may refer to side surfaces arranged in the second direction D2. For example, as illustrated in FIGS. 1 and 2A, "side surfaces in the first direction D1" may have longitudinal directions that extend in the first direction D1, and "side surfaces in the second direction D2" may have longitudinal directions that extend in the second direction D2.

The fin structure 33 may include a portion extending from the first active region 6a in the vertical direction Z. For example, the first lower semiconductor region 6b of the fin structure 33 may extend, e.g., continuously and integrally, from the first active region 6a in the vertical direction Z. Therefore, the first lower semiconductor region 6b may be formed of the same material as the first active region 6a, e.g., silicon.

The stack structures 10a, 10b, 10c, 12a1, 12b1, and 12c1 of the fin structure 33 may include a plurality of first semiconductor layers 10a, 10b, and 10c and a plurality of second semiconductor layers 12a1, 12b1 and 12c1, alternately stacked on the first lower semiconductor region 6b.

The plurality of first semiconductor layers 10a, 10b, and 10c may include a first silicon-germanium layer 10a, a second silicon-germanium layer 10b, and a third silicon-germanium layer 10c, spaced apart from each other in the vertical direction Z. The first silicon-germanium layer 10a may be in, e.g., direct, contact with the first lower semiconductor region 6b.

The plurality of second semiconductor layers 12a1, 12b1, and 12c1 may include a first silicon layer 12a1, a second silicon layer 12b1, and a third silicon layer 12c spaced apart from each other in the vertical direction Z. The first silicon layer 12a1 may be interposed between the first silicon-germanium layer 10a and the second silicon-germanium layer 10b, the second silicon layer 12b1 may be interposed between the second silicon-germanium layer 10b and the third silicon-germanium layer 10c, and the third silicon layer 12c1 may disposed on an upper surface of the third silicon-germanium layer 10c.

In an example, the first silicon-germanium layer 10a, the second silicon-germanium layer 10b, and the third silicon-germanium layer 10c may have the same first thickness, e.g., along the vertical direction Z. In an example, the first lower semiconductor region 6b may have a thickness, e.g., as measured from the upper surface 3S of the semiconductor substrate 3 along the vertical direction Z, greater than the thickness of each of the plurality of first semiconductor layers 10a, 10b, and 10c. In an example, at least one of the plurality of second semiconductor layers 12a1, 12b1, and 12c1 may have a thickness, e.g., along the vertical direction Z, less than the thickness of each of the plurality of first semiconductor layers 10a, 10b, and 10c.

The semiconductor capping layer 27 of the fin structure 33 may be interposed between the first gate structure 45a and the stack structures 10a, 10b, 10c, 12a1, 12b, 12c1, and may extend between the first gate structure 45a and the first lower semiconductor region 6b. The semiconductor capping layer 27 may cover, e.g., continuously, side surfaces 6S2 of the first lower semiconductor region 6b in the second direction D2, side surfaces of the stack structures 10a, 10b, 10c, 12a1, 12b1, and 12c1 in the second direction D2, and upper surfaces of the stack structures 10a, 10b, 10c, 12a1, 12b1, and 12c1. For example, as illustrated in FIG. 2A, the semiconductor capping layer 27 may be continuous and conformal on all surfaces of the stacked structures 6b, 10a, 10b, 10c, 12a1, 12b1, 12c1 that extend above the upper surface 3S of the semiconductor substrate 3, e.g., so the semiconductor capping layer 27 may completely separate the first gate structure 45a from the stacked structures 6b, 10a, 10b, 10c, 12a1, 12b1, 12c1 in the fin structure 33.

In an example, among the plurality of first semiconductor layers 10a, 10b, and 10c and the plurality of second semiconductor layers 12a1, 12b1, and 12c1, a lowermost layer may be a lowermost first semiconductor layer 10a. In the semiconductor capping layer 27, a portion 27L, covering the side surface of the first lower semiconductor region 6b, may have a maximum thickness, e.g., along the second direction D2, different from a minimum thickness, e.g., along the second direction D2, of a portion 27S1 covering the side surface of the lowermost first semiconductor layer 10a. For example, in the semiconductor capping layer 27, the portion 27L, covering the side surface of the first lower semiconductor region 6b, may have a maximum thickness greater than a minimum thickness of the portion 27S1 covering the side surface of the lowermost first semiconductor layer 10a.

In an example, in the semiconductor capping layer 27, the portion 27L, covering the first lower semiconductor region 6b, may have a maximum thickness greater than a minimum thickness of each of portions 27S1 covering the plurality of first semiconductor layers 10a, 10b, and 10c.

In an example, in the semiconductor capping layer 27, each of the portions 27S1, covering the plurality of first semiconductor layers 10a, 10b, and 10c, may have a thickness different from a thickness of each of portions 27S2 covering the plurality of second semiconductor layers 12a1, 12b1, and 12c1.

In an example, in the semiconductor capping layer 27, a thickness of the semiconductor capping layer 27 in the vertical direction Z, disposed on the uppermost second semiconductor layer 12c1 among the plurality of second semiconductor layers 12a, 12b1, and 12c1, may be approximately 4 nm or more, and a thickness of each of the portions 27S1 of the semiconductor capping layer 27, e.g., along the second direction D2, covering the plurality of first semiconductor layers 10a, 10b, and 10c, may be approximately 2 nm or less. Therefore, in the semiconductor capping layer 27, the thickness of the semiconductor capping layer 27, disposed on the uppermost second semiconductor layer 12c, in the vertical direction Z, among the plurality of second semiconductor layers 12a1, 12b1, and 12c1 may be greater than or equal to twice the thickness of each of the portions 27S1 of the semiconductor capping layer 27, e.g., along the second direction D2, covering the plurality of first semiconductor layers 10a, 10b, and 10c. For example, the semiconductor capping layer 27 may include a first portion 27U on an upper surface of an uppermost second semiconductor layer 12c1 of the alternating first and second semiconductor layers 10a, b, 10c 12a1, 12b1 and 12c1 and second portions 27S1 contacting the first semiconductor layers 10a, 10b and 10c. A thickness of the first portion in the vertical direction Z may be greater than or equal to twice a thickness of at least one of the second portions in the second direction D2.

Each of the plurality of first semiconductor layers 10a, 10b, and 10c may have a thickness, e.g., along the vertical direction Z, greater than a thickness of the semiconductor capping layer 27, e.g., along the vertical direction Z in a region on the uppermost second semiconductor layer 12c. Each of the plurality of second semiconductor layers 12a1, 12b1, and 12c1 may have a thickness, e.g., along the vertical direction Z, greater than a thickness of the semiconductor capping layer 27, e.g., along the vertical direction Z in a region on the uppermost second semiconductor layer 12c1.

In the semiconductor capping layer 27, a thickness of the semiconductor capping layer 27 on the uppermost second semiconductor layer 12c1 in the vertical direction Z among the plurality of second semiconductor layers 12a1, 12b1, and 12c1 may be greater than or equal to twice the thickness of each of the portions 27S1 of the semiconductor capping layer 27, e.g., along the second direction D2, covering side surfaces of the first and second silicon layers 12a1 and 12b, among the plurality of second semiconductor layers 12al, 12b1, and 12c.

At least one of the plurality of first semiconductor layers 10a, 10b, and 10c may have concave side surfaces, such that a width of a central portion in the second direction D2 is narrower than widths of an upper portion and a lower portion in the second direction D2. For example, each of the plurality of first semiconductor layers 10a, 10b, and 10c may have concave side surfaces, e.g., side surfaces that curve toward respective centers of the plurality of first semiconductor layers 10a, 10b, and 10c.

At least one of the side surfaces 33S2 of the fin structure 33 in the second direction D2 may protrude, in the second direction D2, further than one of the side surfaces of the first active region 6a in the second direction D2 to overlap a portion of the isolation layer 16a. For example, the side surfaces 33S2 of the fin structure 33 in the second direction D2 may protrude, in the second direction D2, further than side surfaces of the first active region 6a, adjacent to the side surfaces 33S2 of the fin structure 33 in the second direction D2, to overlap a portion of the first isolation layer 16a.

For example, referring to FIG. 2A, a portion of the semiconductor capping layer 27 is a portion of the fin structure 33 that protrudes in the second direction D2 beyond surfaces of the first active region 6a. For example, a portion of the semiconductor capping layer 27, covering the first lower semiconductor region 6b, may overlap a portion of the first isolation layer 16a.

In an example, at least one of the side surfaces 33S2 of the fin structure 33 in the second direction D2 may overlap an upper end of the first buffer insulating layer 18a. In an example, side surfaces 33S2 of the fin structure 33 in the second direction D2 may overlap an upper end of the first buffer insulating layer 18a and may not overlap the first gap-fill insulating layer 20a. In an example, the semiconductor capping layer 27 of the fin structure 33 may overlap an upper end of the first buffer insulating layer 18a and may not overlap the first gap-fill insulating layer 20a.

In an example, the fin structure 33 may include a region having a width gradually increasing in the second direction D2, as a distance in the vertical direction Z from the semiconductor substrate 3 increases, and then decreasing. For example, an upper region 27U of the fin structure 33 may have a width gradually increasing and then decreasing along the second direction D2, as the distance along the vertical direction Z from the semiconductor substrate 3 increases.

In an example, the plurality of first semiconductor layers 10a, 10b, and 10c may not overlap the first isolation layer 16a. In an example, the plurality of second semiconductor layers 12a1, 12b1, and 12c1 may not overlap the first isolation layer 16a.

The first gate structure 45a may extend upwardly of, e.g., above, the isolation layer 16a while covering an upper surface of the fin structure 33, and side surfaces 33S2 of the fin structure 33 in the second direction D2. The first gate structure 45*a* may include a first gate dielectric layer 47*a* and a first gate electrode 49*a* on the first gate dielectric layer 47*a*.

The first gate dielectric layer 47*a* may be in contact with an upper surface of the first isolation layer 16*a*, side surfaces of the fin structure 33 in the second direction D2, and the upper surface of the fin structure 33. The first gate dielectric layer 47*a* may have a thickness greater than a thickness of the semiconductor capping layer 27, e.g., in the second direction D2.

In an example, the first gate dielectric layer 47*a* may include a first material layer 47*a*_1 and a second material layer 47*a*_2 on the first material layer 47*a*_1. The second material layer 47*a*_2 may extend upwardly of a side surface of the first gate electrode 49*a*. The first material layer 47*a*_1 may be formed of, e.g., a silicon oxide, and the second material layer 47*a*_2 may be formed of, e.g., a high-k dielectric.

The first material layer 47*a*_1 of the first gate dielectric layer 47*a* of the first gate structure 45*a* may be formed of an oxidation oxide and a deposition oxide. For example, forming the first material layer 47*a*_1 of the first gate dielectric layer 47*a* of the first gate structure 45*a* may include oxidizing a surface of the semiconductor capping layer 27 to form an oxidation oxide and performing a deposition process on the oxidation oxide to form a deposition oxide. In an example, the first material layer 47*a*_1 may have a thickness greater than a thickness of the second material layer 47*a*_2.

A first gate capping layer 53*a* may be disposed on the first gate structure 45*a*. The first gate capping layer 53*a* may be formed of an insulating material, e.g., a silicon nitride, or the like.

First gate spacers 56*a* may be disposed on side surfaces of the first gate structure 45*a* and the first gate capping layer 53*a*. The first gate spacers 56*a* may be disposed on the semiconductor capping layer 27 of the fin structure 33.

The first source/drain regions 40*a* may be in contact with the side surfaces 33S1 of the fin structure 33 in the first direction D1. First contact plugs 62*a* may be disposed on opposite sides adjacent to the first gate structure 45*a* to be electrically connected to the first source/drain regions 40*a*. In an example, a first insulating layer 59*a* may be disposed between the first contact plugs 62*a* and the first gate spacers 56*a*.

Referring to FIG. 2B together with FIGS. 1 and 2A, a second active region 8*a* protruding from the semiconductor substrate 3 in the vertical direction Z, a second lower semiconductor region 8*b* extending from the second active region 8*a* in the vertical direction Z, a plurality of semiconductor channel layers 12*a*2, 12*b*2, and 12*c*2 spaced apart from each other in the vertical direction Z on the lower semiconductor region 8*b*, a second gate structure 45*b* overlapping the plurality of semiconductor channel layers 12*a*2, 12*b*2, and 12*c*2, and second source/drain regions 40*b* on the second active region 8*a* may be disposed in a second transistor region TR2.

The second active region 8*a* may be spaced apart from the first active region 6*a*. The second active region 8*a* may extend in the first direction D1.

A second isolation layer 16*b* may be disposed to cover the upper surface 3S of the semiconductor substrate 3 and side surfaces of the second active region 8*a*. The second isolation layer 16*b* includes a second buffer insulating layer 18*b* covering the side surfaces of the second active regions 8*a*, a second insulating liner 19*b* covering the second buffer insulating layer 18*b*, and a second gap-fill insulating layer 20*b* covering the second insulating liner 19*b*.

The first buffer insulating layer 18*a* and the second buffer insulating layer 18*b* may be formed of the same material, e.g., silicon oxide. The first insulating liner 19*a* and the second insulating liner 19*b* may be formed of the same material, e.g., silicon nitride. The first gap-fill insulating layer 20*a* and the second gap-fill insulating layer 20*b* may be formed of the same material, e.g., silicon oxide.

The plurality of semiconductor channel layers 12*a*2, 12*b*2, and 12*c*2 may include a first semiconductor channel layer 12*a*2 on the second lower semiconductor region 8*b*, a second semiconductor channel layer 12*b*2 on the first semiconductor channel layer 12*a*2, and a third semiconductor channel layer 12*c*2 on the second semiconductor channel layer 122*b*.

Each of the plurality of semiconductor channel layers 12*a*2, 12*b*2, and 12*c*2 may have substantially the same thickness, e.g., along the vertical direction Z, as a thickness of each of the plurality of second semiconductor layers 12*a*1, 12*b*1, and 12*c*1. The plurality of semiconductor channel layers 12*a*2, 12*b*2, and 12*c*2 and the plurality of second semiconductor layers 12*a*1, 12*b*1, and 12*c*1 may be formed of the same material, e.g., an epitaxially grown silicon material.

The second gate structure 45*b* may overlap the plurality of semiconductor channel layers 12*a*2, 12*b*2, and 12*c*2 and may extend in the second direction D2 to be disposed on the second isolation layer 16*b*. The second gate structure 45*b* may cover the upper surface of the second lower semiconductor region 8*b* and the side surfaces of the second lower semiconductor region 8*b* in the second direction D2 while extending in the second direction D2, and may surround each of the plurality of semiconductor channel layers 12*a*2, 12*b*2, and 12*c*2. The second gate structure 45*b* may cover an upper surface, a lower surface of each of the plurality of semiconductor channel layers 12*a*2, 12*b*2, and 12*c*2, and a side surface of each of the plurality of semiconductor channel layers 12*a*2, 12*b*2, and 12*c*2 in the second direction while extending in the second direction D2.

The second gate structure 45*b* may include a second gate dielectric layer 47*b* and a second gate electrode 49*b*. In an example, the first gate dielectric layer 47*a* may have a thickness greater than a thickness of the second gate dielectric layer 47*b*.

The second gate dielectric layer 47*b* may include a third material layer 47*b*_1 and a fourth material layer 47*b*_2. The fourth material layer 47*b*_2 of the second gate dielectric layer 47*b* may be disposed between the second gate electrode 49*b* and the second lower semiconductor region 8*b*, between the second gate electrode 49*b* and the first semiconductor channel layer 12*a*2, between the second gate electrode 49*b* and the second semiconductor channel layer 12*b*2, between the second gate electrode 49*b* and the third semiconductor channel layer 12*c*2, and between the second gate electrode 49*b* and the second source/drain regions 40*b*, and may cover side surfaces of the second gate electrode 49*b*. In an example, the third material layer 47*b*_1 of the second gate dielectric layer 47*b* may be disposed between the fourth material layer 47*b*_2 and the second lower semiconductor region 8*b*, between the fourth material layer Between 47*b*_2 and the first semiconductor channel layer 12*a*2, between the fourth material layer 47*b*_2 and the second semiconductor channel layer 12*b*2, and between the fourth material layer 47*b*_2 and the third semiconductor channel layers 12*c*2.

The second source/drain regions 40*b* may extend in the vertical direction Z on the second active region 8*a* to be in contact with side surfaces of the plurality of semiconductor channel layers 12a2, 12b2, and 12c2 in the first direction D1. For example, as illustrated in FIG. 2B, the second source/drain regions 40b may at least partially overlap lower parts of side surfaces of the second gate structure 45b.

According to example embodiments, a first transistor may be provided in the first transistor region TR1. The first transistor may include the first gate structure 45a, the first source/drain regions 40a, and the fin structure 33 between the first source/drain regions 40a. The fin structure 33 may be provided as a channel region of the first transistor.

The first gate dielectric layer 47a of the first gate structure 45a may not be in direct contact with the plurality of first semiconductor layers 10a, 10b, and 10c, which may be formed of silicon-germanium, and may be in direct contact with the semiconductor capping layer 27 which may be formed of silicon. As described above, the first gate dielectric layer 47a of the first gate structure 45a may be spaced apart from the plurality of first semiconductor layers 10a, 10b, and 10c and may be in direct contact with the semiconductor capping layer 27 to improve reliability of the first gate dielectric layer 47a, to prevent a threshold voltage of the first transistor from abnormally decreasing or becoming unstable, and to improve electrical characteristics of the first transistor.

According to example embodiments, a second transistor may be provided in the second transistor region TR2. The second transistor may include the second gate structure 45b, the second source/drain regions 40b, and the semiconductor channel layers 12a2, 12b2, and 12c2 between the second source/drain regions 40b. The second transistor may be a gate-all-around (GAA) MOSFET.

Figure 3:
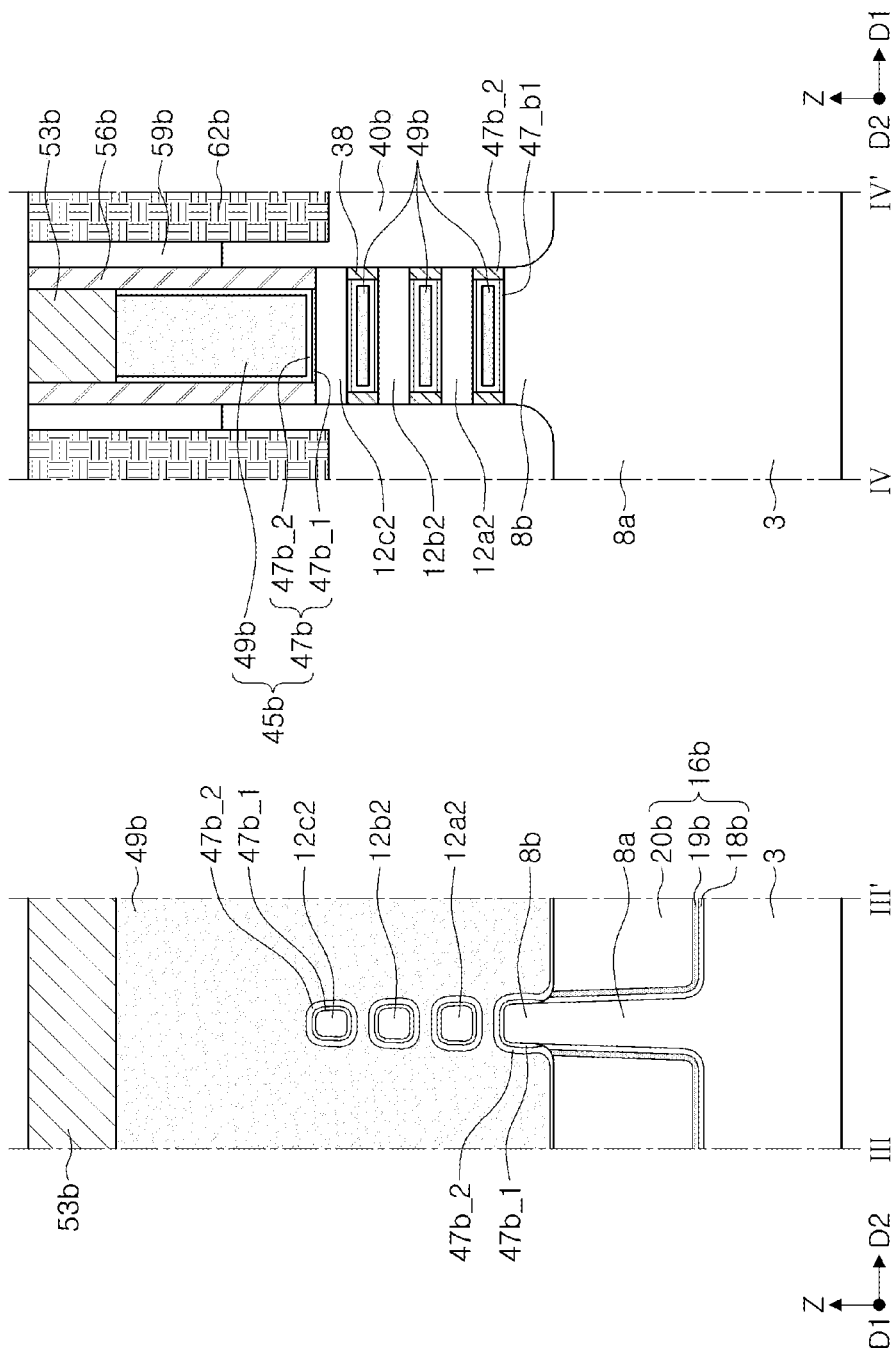
FIG. 3 illustrates a cross-sectional view of a modified example of a semiconductor device according to an example embodiment.

In an example, the second gate structure 45b may be in direct contact with the second source/drain regions 40b, but example embodiments are not limited thereto. For example, the second gate structure 45b may be spaced apart from the second source/drain regions 40b. Such a modified example, in which the second gate structure 45b and the second source/drain regions 40b are spaced apart from each other, will be described with reference to FIG. 3. FIG. 3 is a cross-sectional view, taken along lines III-III' and IV-IV' in FIG. 1, illustrating the modified example in which the second gate structure 45b and the second source/drain regions 40b are spaced apart from each other.

Referring to FIG. 3, insulating spacers 38 may be disposed between the second gate structure 45b and the second source/drain regions 40b. The second gate structure 45b and the second source/drain regions 40b may be spaced apart from each other by the insulating spacers 38.

Returning again to FIGS. 2A and 2B, each of the plurality of second semiconductor layers 12a1, 12b1, and 12c1 and the plurality of semiconductor channel layers 12a2, 12b2, and 12c2 may have the same thickness, but example embodiments may not be limited thereto. For example, in a modified example, one of the plurality of second semiconductor layers 12a, 12b1, and 12c1 may have a thickness different from a thickness of each of the other second semiconductor layers, and one of the plurality of semiconductor channel layers 12a2, 12b2, and 12c2 may have a thickness different from a thickness of each of the other semiconductor channel layers. Such a modified example will be described with reference to FIGS. 4A and 4B and FIGS. 5A and 5B.

Figure 4A:
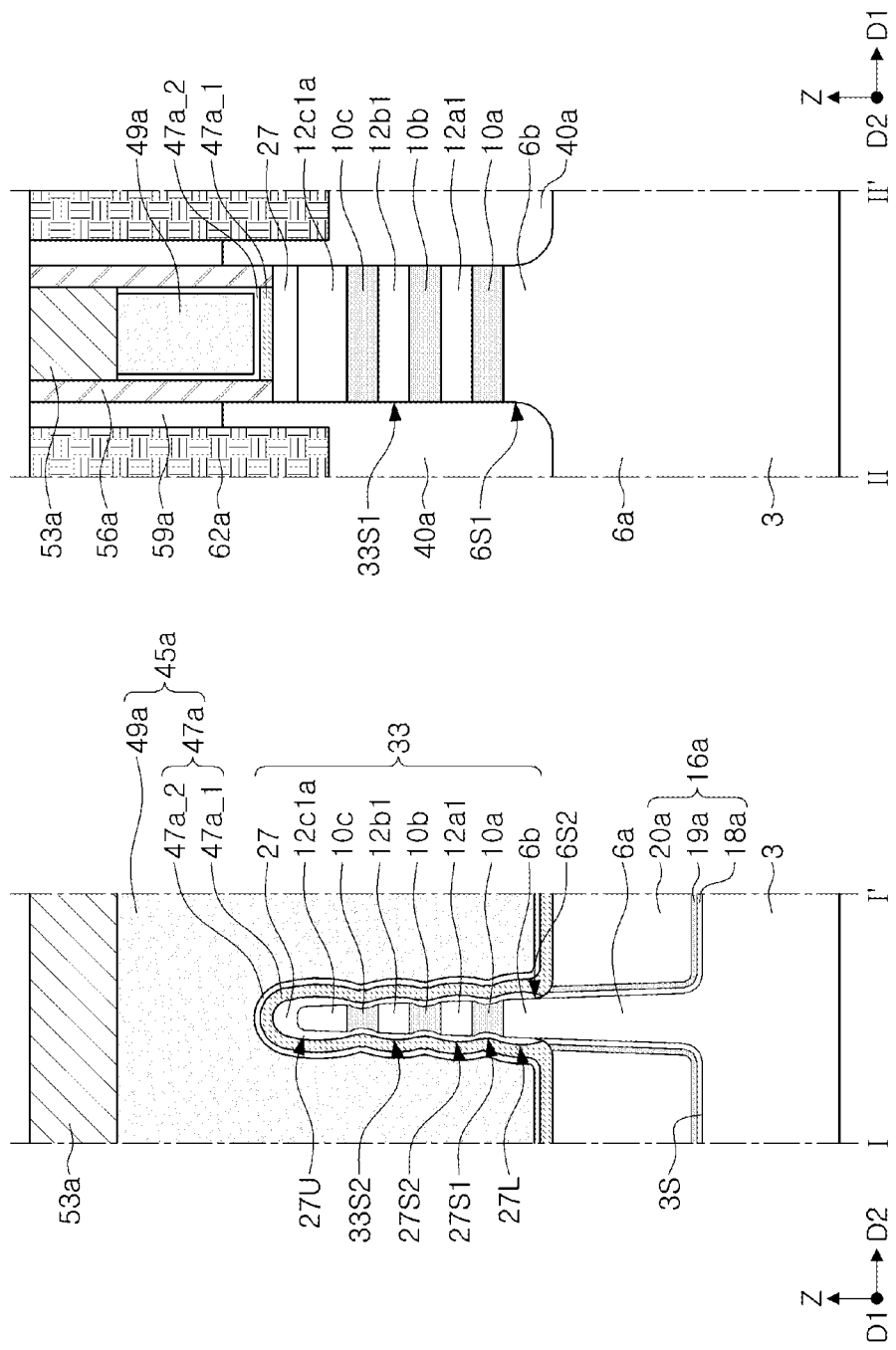
FIGS. 4A and 4B illustrate cross-sectional views of a modified example of a semiconductor device according to an example embodiment.
Figure 4B:
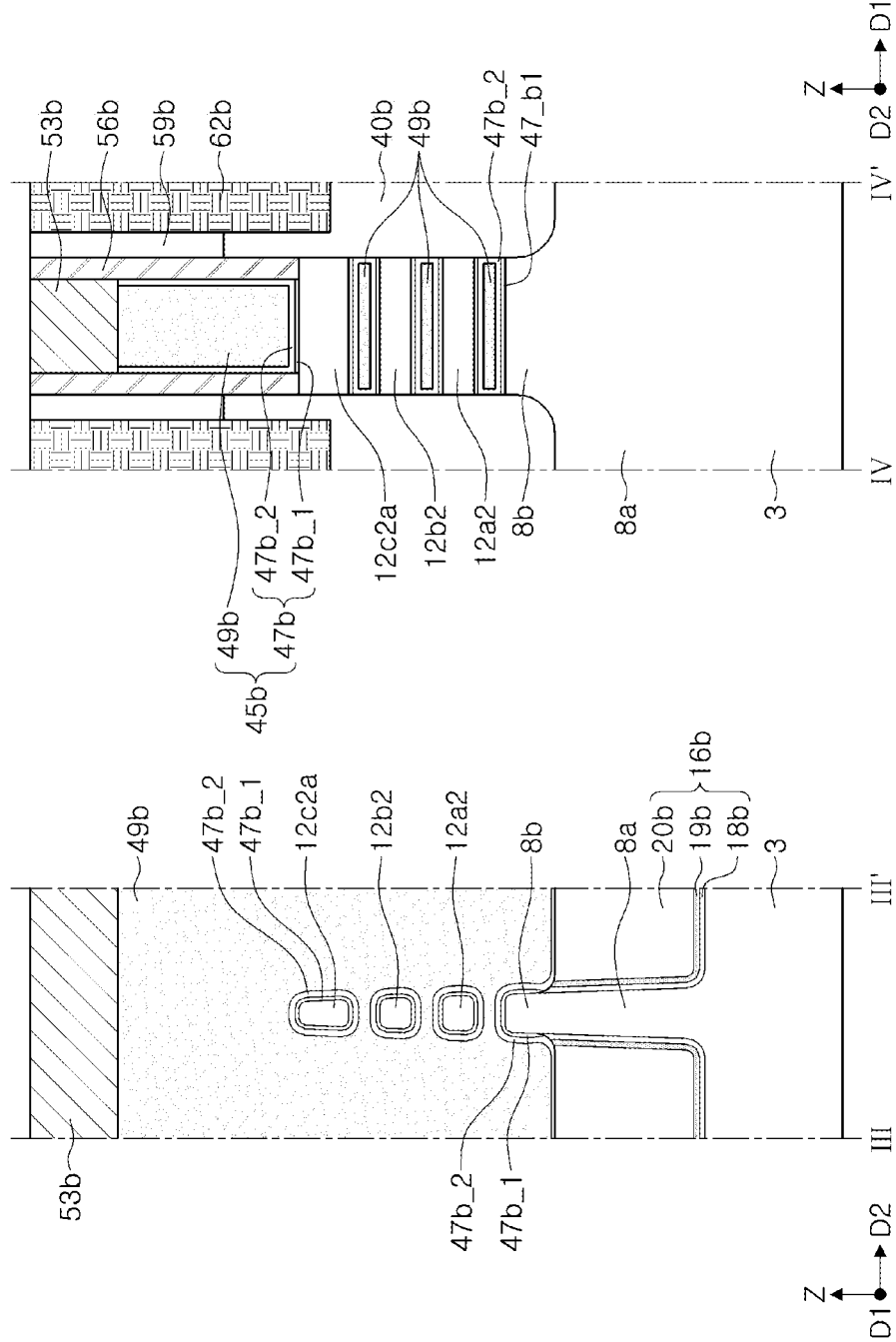

In a modified example, referring to FIGS. 4A and 4B, among a plurality of second semiconductor layers 12a1, 12b1, and 12c1a spaced apart from each other in a vertical direction Z, a second uppermost semiconductor layer 12c1a may have a thickness greater than a thickness of each of the other second semiconductor layers 12a1 and 12b1. Among the plurality of semiconductor channel layers 12a2, 12b2, and 12c2a spaced apart from each other in the vertical direction Z, an uppermost semiconductor channel layer 12c2a may have a thickness greater than a thickness of each of the other semiconductor channel layers 12a2 and 12b2.

Figure 5A:
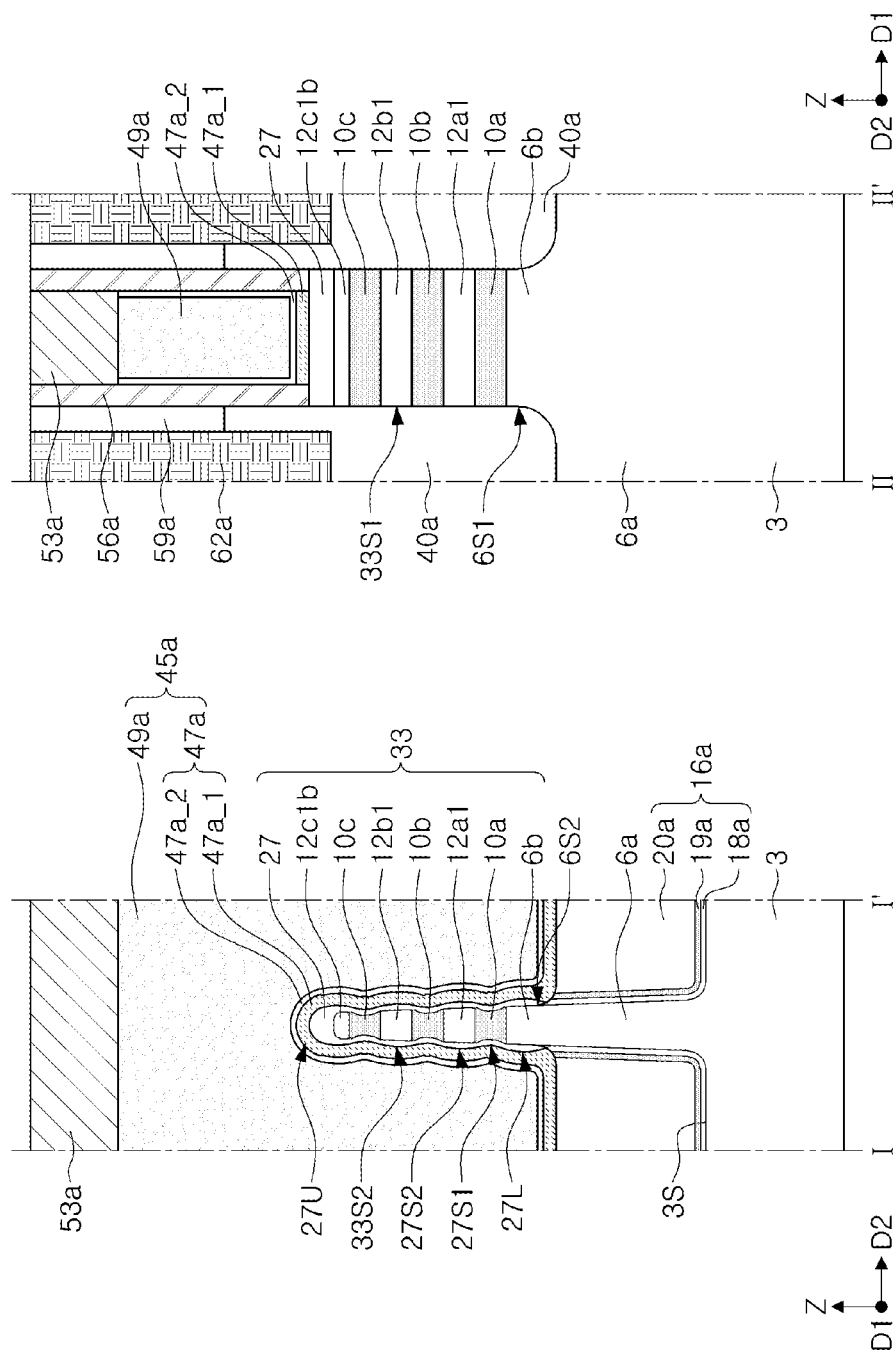
FIGS. 5A and 5B illustrate cross-sectional views of a modified example of a semiconductor device according to an example embodiment.
Figure 5B:
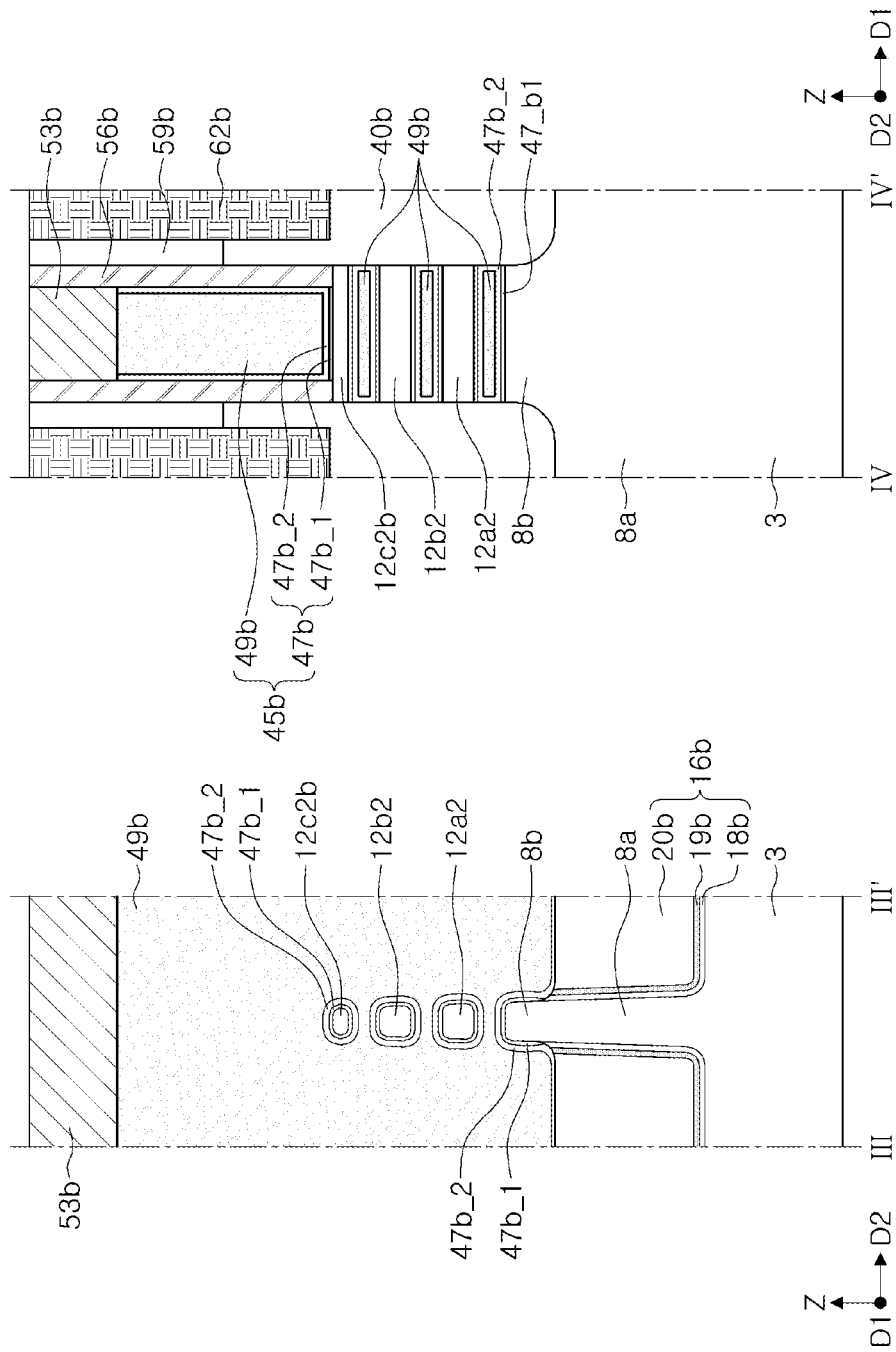

In another modified example, referring to FIGS. 5A and 5B, among the plurality of second semiconductor layers 12a1, 12b1, and 12c1b spaced apart from each other in the vertical direction Z, an uppermost second semiconductor layer 12c1b may have a thickness smaller than a thickness of each of the other second semiconductor layers 12a1 and 12b1. Among the plurality of semiconductor channel layers 12a2, 12b2, and 12c2b spaced apart from each other in the vertical direction Z, an uppermost semiconductor channel layer 12c2b may have a thickness less than a thickness of each of the other semiconductor channel layers 12a2 and 12b2.

Next, the above modified example of the semiconductor capping layer (27 in FIG. 2A) will be described with reference to FIG. 6.

Figure 6:
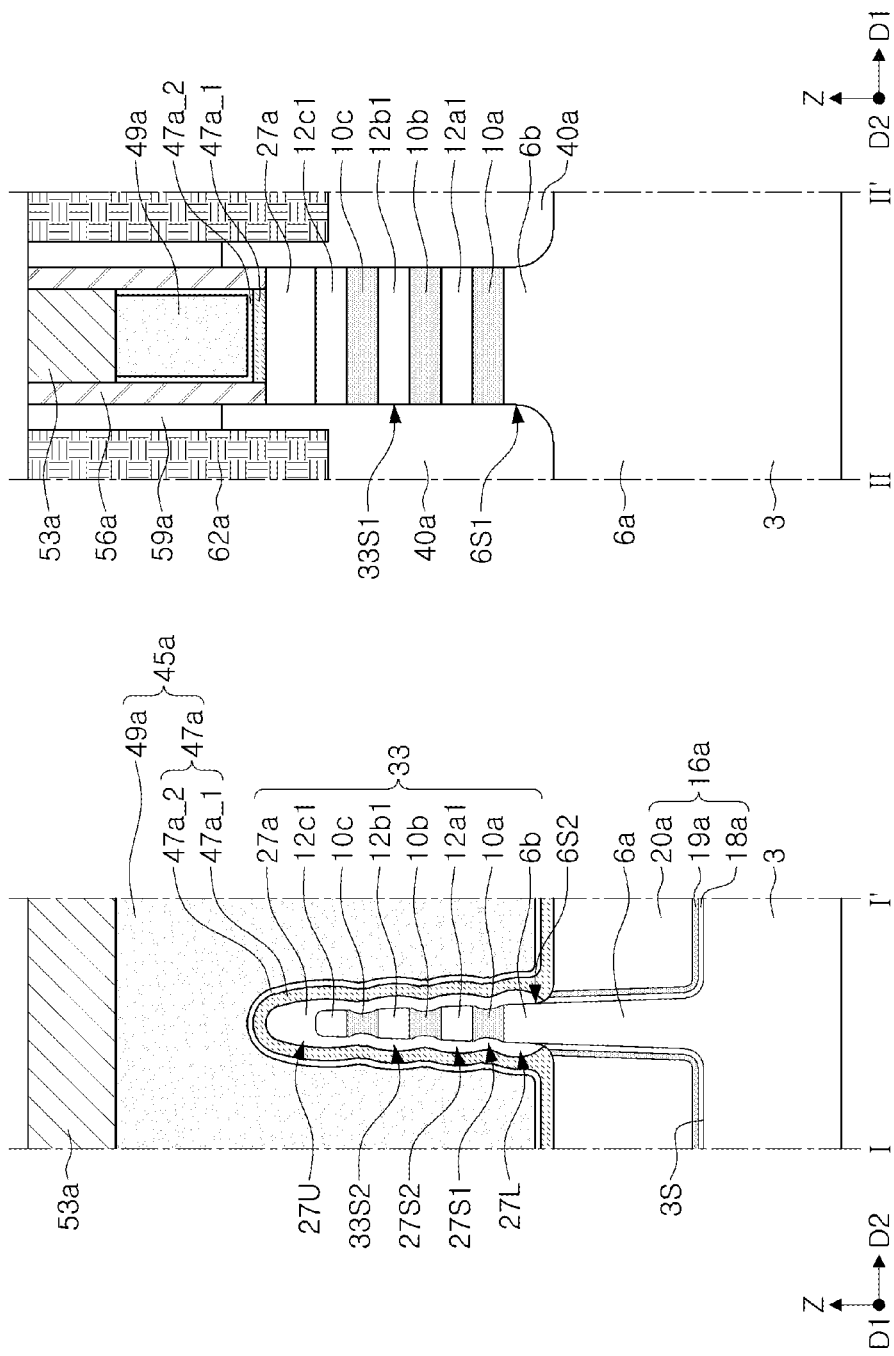
FIG. 6 illustrates a cross-sectional view of a modified example of a semiconductor device according to an example embodiment.

In the modified example, referring to FIG. 6, a semiconductor capping layer 27a having an increased thickness may be disposed. The semiconductor capping layer 27a may overlap an upper end of the first buffer insulating layer 18a and an upper end of the first insulating liner 19a in the vertical direction Z.

Next, the above modified example of the fin structure (33 in FIG. 2A) will be described with reference to FIG. 7.

Figure 7:
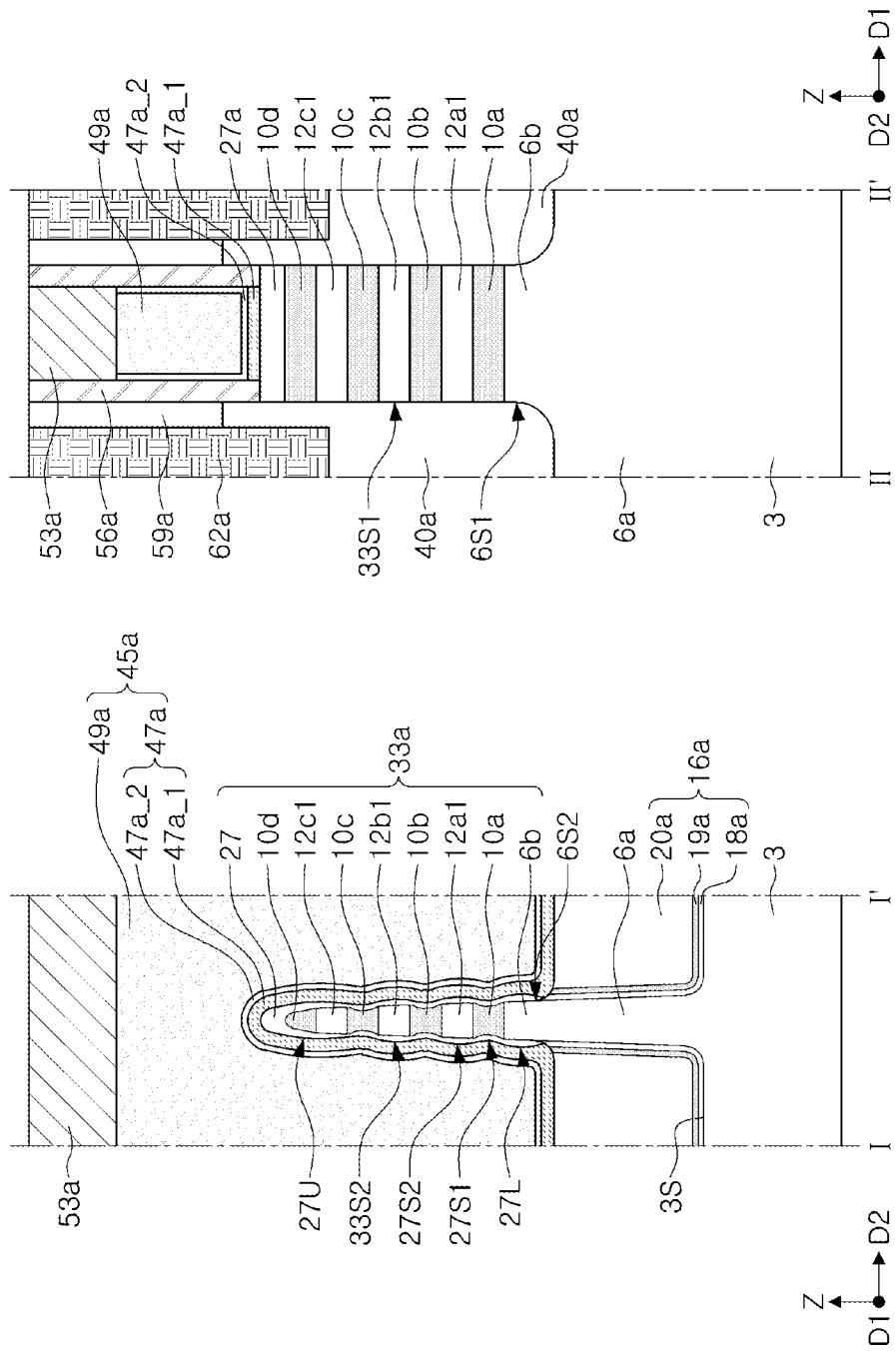
FIG. 7 illustrates a cross-sectional view of a modified example of a semiconductor device according to an example embodiment.

Referring to FIG. 7, the fin structure 33a may include a plurality of first semiconductor layers 10a, 10b, 10c, and 10d, and a plurality of second semiconductors, alternately stacked on the first lower semiconductor region 6b. Among the plurality of first semiconductor layers 10a, 10b, 10c, and 10d, and the plurality of second semiconductors, alternately stacked, a lowermost layer may be a lowermost first semiconductor layer 10a and an uppermost layer may be an uppermost first semiconductor layer 10d.

Figure 8:
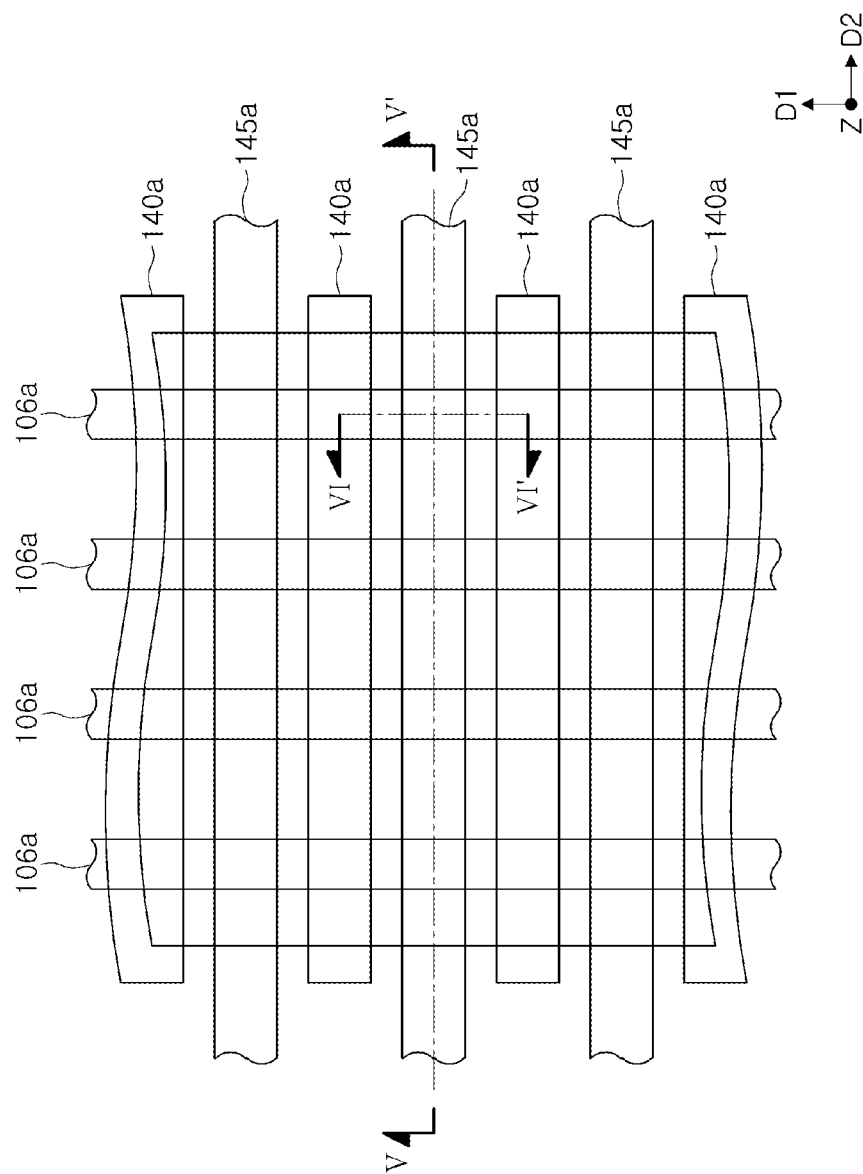
FIG. 8 illustrates a plan view of a modified example of a semiconductor device according to an example embodiment.

Next, the above modified example of the first active region (6a in FIGS. 1 and 2A), the first gate electrode (45a in FIGS. 1 and 2A), the source/drain regions (40a in FIGS. 1 and 2A), and the first isolation layer (16a in FIGS. 1 and 2A) will be described with reference to FIGS. 8 and 9. FIG. 8 is a plan view illustrating a modified example of the semiconductor device according to an example embodiment, and FIG. 9 is a cross-sectional view taken along lines V-V' and VI-VI' in FIG. 8.

Figure 9:
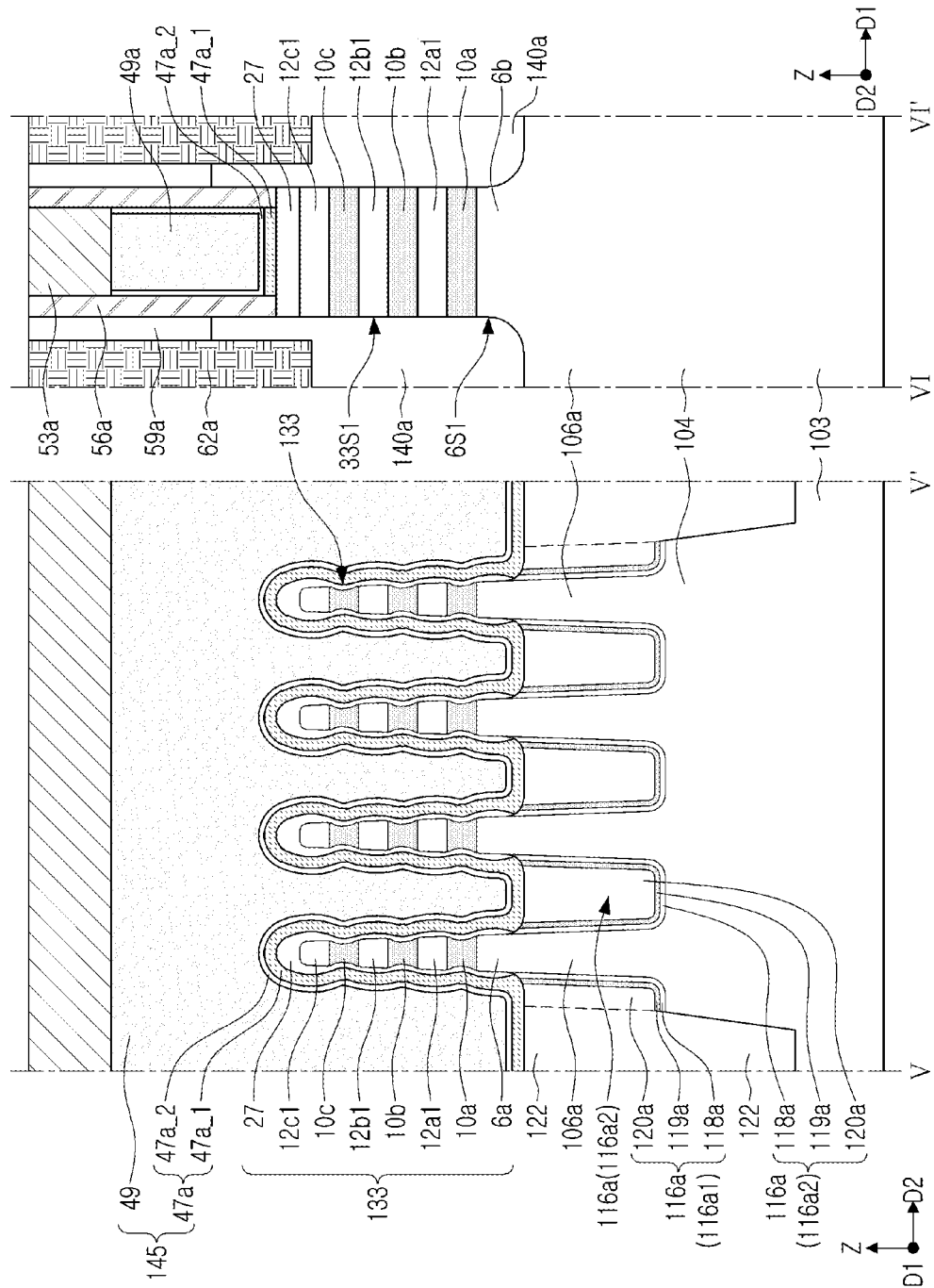
FIG. 9 illustrates a cross-sectional view of a modified example of a semiconductor device according to an example embodiment.

Referring to FIGS. 8 and 9, a base active region 104 protruding from a semiconductor substrate 103, a plurality of first active regions 106a extending from the base active region 104 in the vertical direction Z, and fin structures 133 extending from the first active regions 106a in the vertical direction Z, respectively, may be disposed. The first active regions 106a may extend in the first direction D1.

Shallow isolation layers 116a may be disposed on the base active region 104 to define the plurality of first active regions 106a. Deep isolation layers 122 may be disposed to define the base active region 104 and surround external sides of the shallow isolation layers 116a.

The shallow isolation layers 116a may include a first shallow isolation portion 116a1 and a second shallow isolation portion 116a2. The first shallow isolation portion 116a1 may be in contact with the deep isolation layer 122 in the second direction D2. The second shallow isolation portion 116a2 may be interposed between the first active regions 106a.

Each of the shallow isolation layers 116a may include a buffer insulating layer 118a covering a surface of the base active region 104 and extending upwardly of side surfaces of each of the first active regions 106a, an insulating liner 119a covering the buffer insulating layer 118a, and a gap-fill insulating layer 120a covering the insulating liner 119a.

The fin structures 133 may be disposed on the first active regions 106a. Each of the fin structures 133 may extend from each of the first active regions 106a in the vertical direction Z.

Each of the fin structures 133 may be formed of substantially the same material as the above-described fin structure (33 in FIG. 2A) and may be formed to have substantially the same structure as the above-described fin structure (33 in FIG. 2A). Accordingly, each of the fin structures 133 may include the first lower semiconductor region 6b, the plurality of first semiconductor layers 10a, 10b, and 10c, and the plurality of second semiconductor layers 12a1, 12b1, and 12c1, and the semiconductor capping layer 27, described above with reference to FIG. 2A.

A plurality of gate structure 145 may be disposed parallel to each other, and may overlap the fin structures 133 and extend in the second direction D2. Each of the plurality of gate structures 145 may be formed of substantially the same material as the above-described first gate structure (45a in FIG. 2A) and may be formed to have substantially the same structure as the above-described first gate structure (45a in FIG. 2A). Accordingly, since the structure and material of the plurality of gate structures 145 can be understood from the first gate structure (45a in FIG. 2A), detailed description thereof will be omitted.

Source/drain regions 140a may be formed to be in contact with side surfaces 33S1 of each of the fin structures 133 in the first direction D1, on the first active regions 106a.

Similarly as described above in FIG. 2A, a gate capping layer 53a may be disposed on each of the plurality of gate structures 145, a gate spacer 56a may be disposed on side surfaces of each of the plurality of gate structures 145 and side surfaces of the gate capping layer 43a, a contact plug 62a may be disposed on the source/drain regions 140a, and an insulating layer 59a may be disposed between the contact plug 62a and the gate spacer 56a.

Figure 10:
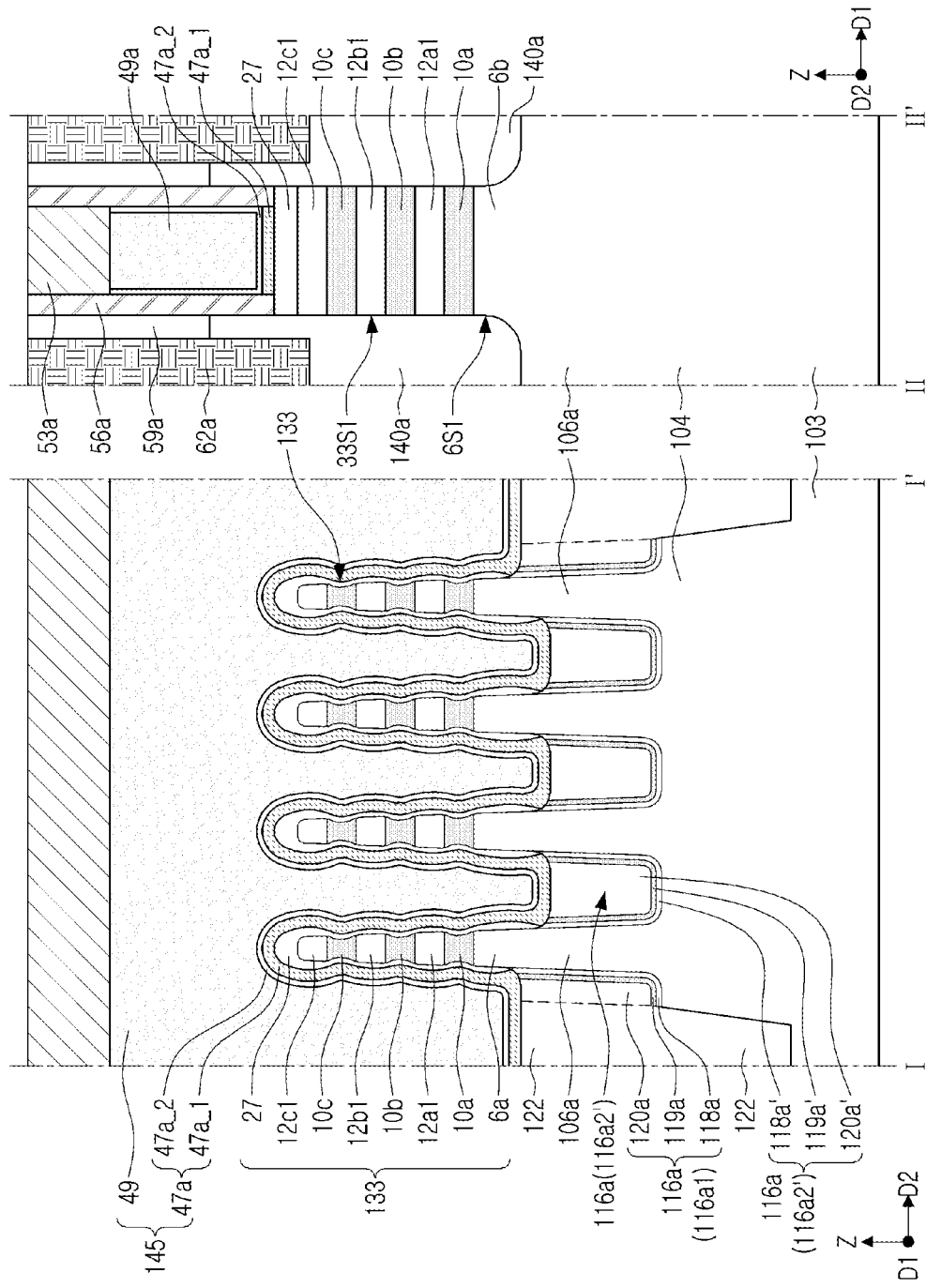
FIG. 10 illustrates a cross-sectional view of a modified example of a semiconductor device according to an example embodiment.

The first shallow isolation portion 116a1 and the second shallow isolation portion 116a2 may have upper surfaces disposed at substantially the same level, but example embodiments are not limited thereto. For example, the upper surface of the second shallow isolation portion 116a2 may be modified to be disposed on a level different from a level of the upper surface of the first shallow isolation portion 116a1. Such a modified example will be described with reference to FIG. 10. FIG. 10 is a cross-sectional view along lines V-V' and VI-VI' in FIG. 8.

In the modified example, referring to FIG. 10, the shallow isolation layers 116a, described above in FIG. 9, may include a first shallow isolation portion 116a1 and a second shallow isolation portion 116a2' having an upper surface disposed at a level lower than a level of an upper surface of the first shallow isolation portion 116a1. Since the upper surface of the second shallow isolation portion 116a' is disposed lower than the upper surface of the first shallow isolation portion 116a1, lower ends of the fin structures 133, disposed to be in contact with the second shallow isolation portion 116a2, may be lower than lower ends of the fin structures 133, disposed to be in contact with the first shallow isolation portion 116a1.

Figure 11:
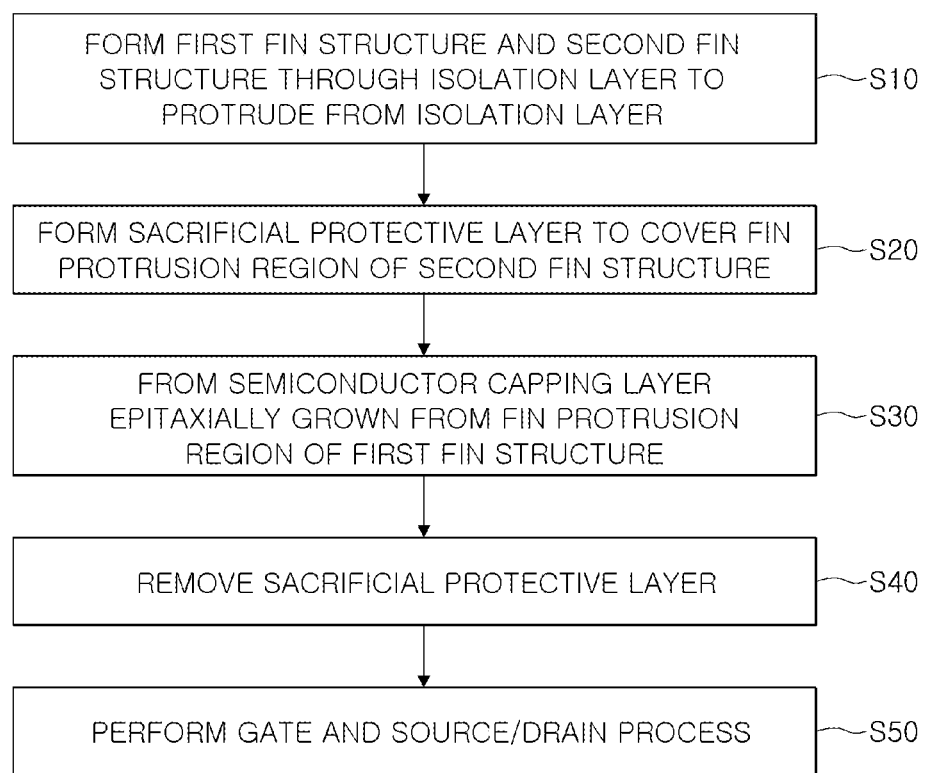
FIG. 11 illustrates a process flowchart of a method of forming a semiconductor device according to example embodiments.

Next, an example of a method of forming a semiconductor device according to example embodiments will be described with reference to FIGS. 1, 11, and 12A to 14B. FIG. 11 is a process flowchart illustrating a method of forming a semiconductor device in accordance with example embodiments, and FIGS. 12A to 14B are cross-sectional views illustrating stages in a method of forming a semiconductor device according to example embodiments. In FIGS. 12A to 14B, FIGS. 12A, 13A, and 14A are cross-sectional views taken along lines I-I' and III-III' in FIG. 1, and FIGS. 12B, 13B, and 14B are cross-sectional views taken along lines II-II' and IV-IV' in FIG.

Referring to FIGS. 1, 11, 12A and 12B, the first fin structure and the second fin structure may be formed through the isolation layers 16a and 16b to protrude from the isolation layers 16a and 16b (S10). Forming the first fin structure and the second fin structure through the isolation layers 16a and 16b to protrude from the isolation layers 16a and 16b may include performing an epitaxial growth process on the semiconductor substrate 3 to form a plurality of silicon-germanium layers 10 and a plurality of silicon layers 12, alternately stacked, etching the plurality of silicon-germanium layers 10, the plurality of silicon layers 12, and the semiconductor substrate 3 to form the first fin structure and the second fin structure, and form the isolation layers 16a and 16b to cover lower side surfaces of the first fin structure and the second fin structure, disposed below the plurality of silicon-germanium layers 10 and the plurality of silicon layers 12, on the semiconductor substrate 3.

Forming the isolation layers 16a and 16b may include oxidizing a surface of the semiconductor substrate 3 and surfaces of the first fin structure and the second fin structure to form buffer insulating layers 18a and 18b after etching the plurality of silicon-germanium layers 10, the plurality of silicon layers 12, and the semiconductor substrate 3 to form the first fin structure and the second fin structure, forming insulating liners 19a and 19b to conformally cover the buffer insulating layers 18a and 18b, forming gap-fill insulating layers 20a and 20b on the insulating liners 19a and 19b, and etching the gap-fill insulating layers 20a and 20b, the insulating liners 19a and 19b, and the buffer insulating layers 18a and 18b to expose upper regions of the first fin structure and the second fin structure.

The side surfaces of the plurality of silicon-germanium layers 10 may be concavely recessed further than the side surfaces of the plurality of silicon layers 12 while forming the isolation layers 16a and 16b. For example, the side surfaces of the plurality of silicon-germanium layers 10 may be concavely recessed further than the side surfaces of the plurality of silicon layers 12 while thermally oxidizing the plurality of silicon-germanium layers 10 and the plurality of silicon layers 12 to form the buffer insulating layers 18a and 18b.

The first fin structure may be formed in the first transistor region (TR1 in FIG. 1), and the second fin structure may be formed in the second transistor region (TR2 in FIG. 1). The isolation layer, disposed in the first transistor region TR1 in FIG. 1, may be defined as a first isolation layer 16a and the isolation layer, disposed in the second transistor region (TR2 in FIG. 1), may be defined as a second isolation layer 16b.

The first fin structure, formed in the first transistor region (TR1 in FIG. 1), may include the first active region 6a having a side surface surrounded by the first isolation layer 16a, the first lower semiconductor region 6b disposed at a level higher than a level of the isolation layer 16a, and the plurality of silicon-germanium layers 10 and the plurality of silicon layers 12 formed on the first lower semiconductor region 6b. The first active region 6a and the first lower semiconductor region 6b may be formed while etching the semiconductor substrate 3.

The second fin structure, formed in the second transistor region (TR2 in FIG. 1), may include the second active region 8a having a side surface surrounded by the second isolation layer 16b, a second lower semiconductor region 8b disposed at a level higher than a level of the second isolation layer 16b, and the plurality of silicon-germanium layers 10 and the plurality of silicon layers 12 formed on the second lower semiconductor region 8b. The second active region 8a and the second lower semiconductor region 8b may be formed while etching the semiconductor substrate 3.

In the first fin structure, a portion protruding from the first isolation layer 16a may be defined as a first fin protrusion region 6P. In the second fin structure, a portion protruding from the second isolation layer 16b may be defined as a second fin protrusion region 8P.

A sacrificial protective layer may be formed to cover first and second fin protrusion regions 6P and 8P of the first and second fin structures. For example, a first sacrificial protective layer 24a, a second sacrificial protective layer 24b, and a third sacrificial protective layer 24c may be sequentially formed to cover surfaces of the first and second fin protrusion regions 6P and 8P and the first and second isolation layers 16a and 16b. The first sacrificial protective layer 24a and the second sacrificial protective layer 24b may be formed of, e.g., silicon oxide, and the third sacrificial protective layer 24c may be formed of, e.g., silicon nitride.

Figure 13A:
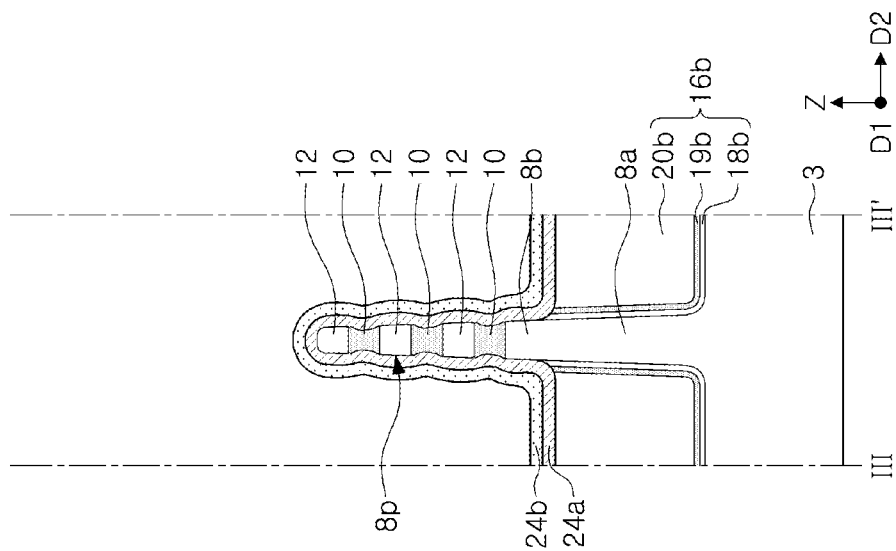
Figure 13A:
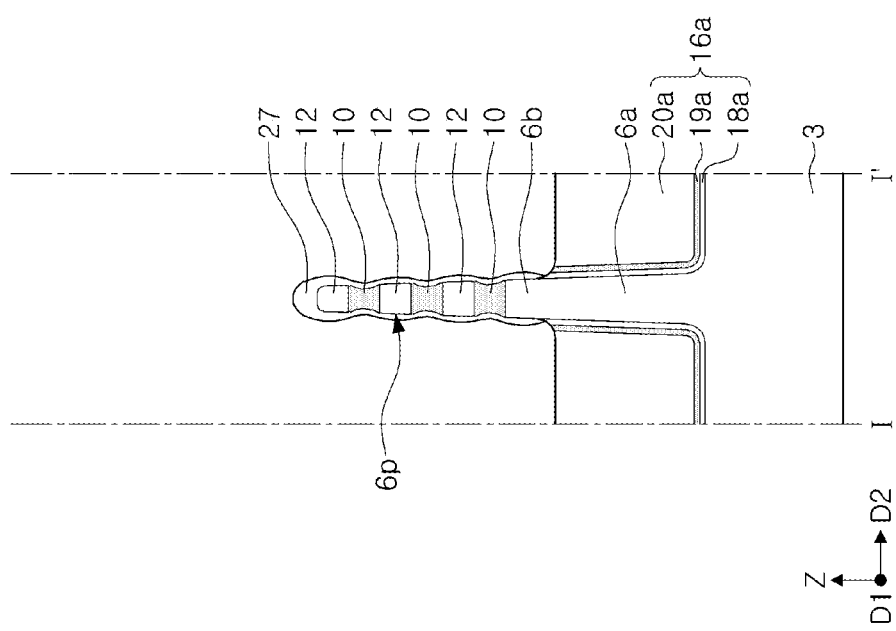
Figure 13B:
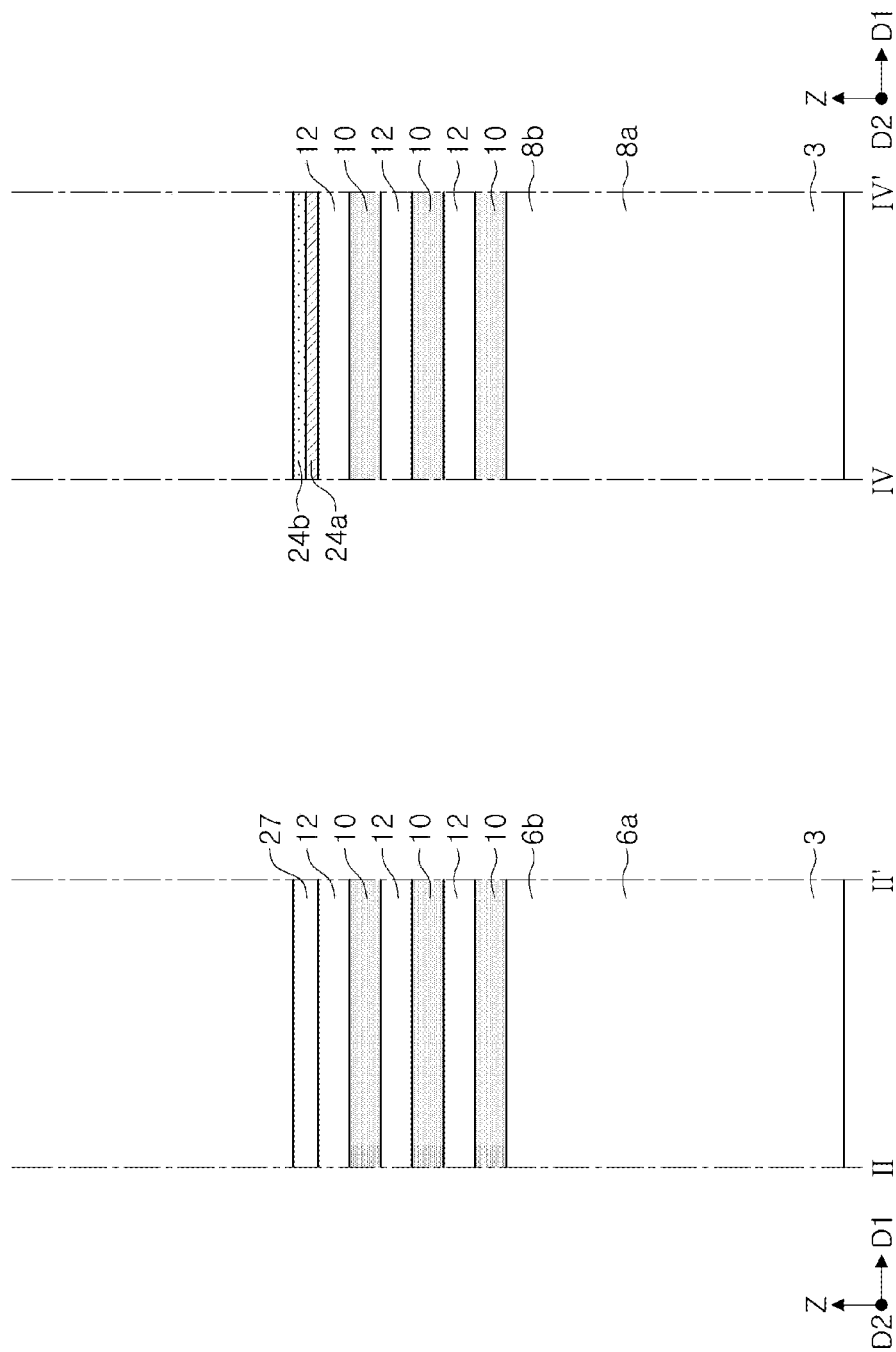

Referring to FIGS. 11, 13A, and 13B, A sacrificial protective layer may be formed to cover the second fin protrusion region 8P of the second fin structure (S20). For example, the first sacrificial protective layer 24a, the second sacrificial protective layer 24b, and the third sacrificial protective layer 24c on the first isolation layer 16a and the first fin protrusion region 6P may be removed. Then, among the first sacrificial protective layer 24a, the second sacrificial protective layer 24b, and the third sacrificial protective layer 24c remaining on the second isolation layer 16b and the second fin protrusion region 8P, the third sacrificial protective layer 24c may be removed. Accordingly, the first and second sacrificial protective layers 24a and 24b may be formed to cover the second fin protrusion region 8P of the second fin structure. A semiconductor capping layer 27, epitaxially grown from the first fin protrusion region 6P of the first fin structure, may be formed (S30).

Figure 14A:
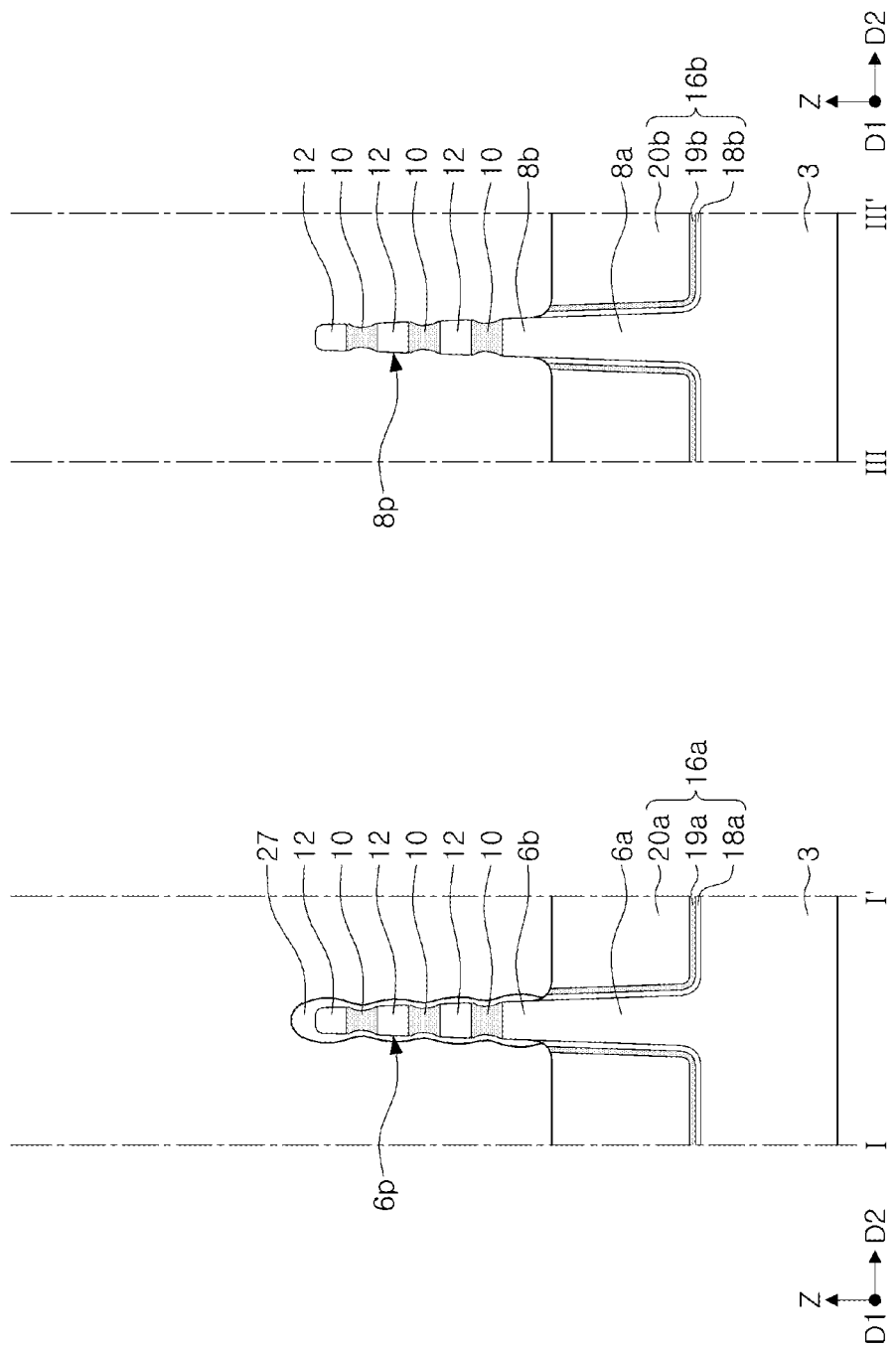
Figure 14B:
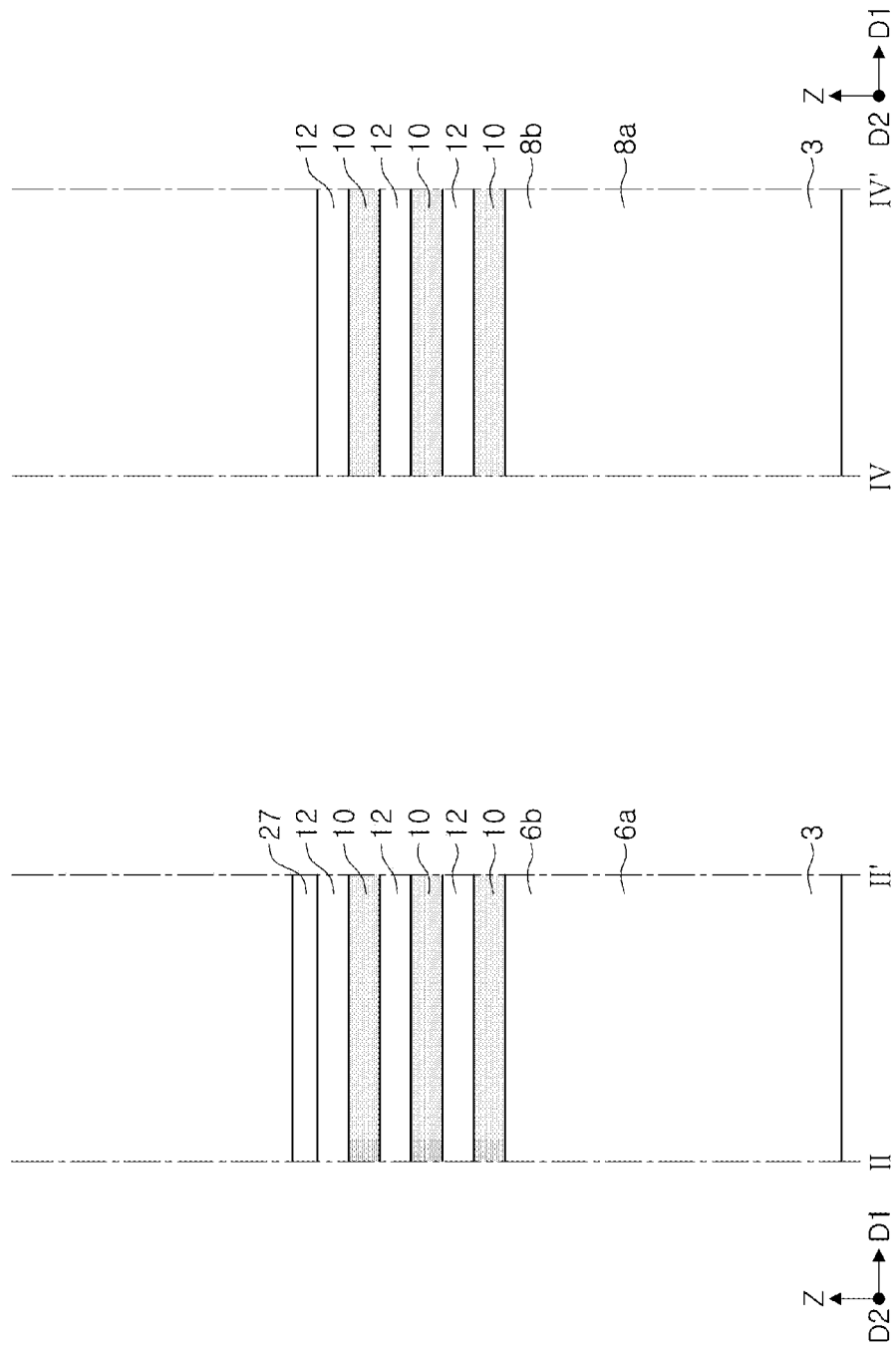

Referring to FIGS. 11, 14A, and 14B, the sacrificial protective layer may be removed (S40). Removing the sacrificial protective layer may include removing the first sacrificial protective layer 24a and the second sacrificial protective layer 24b remaining on the second isolation layer 16b and the second fin protrusion region 8P.

Accordingly, the first fin protrusion region 6P and the semiconductor capping layer 27 may be formed in the first transistor region TR1, and the second fin protrusion region 8P, not covered with the semiconductor capping layer 27, may be formed in the second transistor region TR2. The first fin protrusion region 6P and the semiconductor capping layer 27 may be used to form the fin structure (33 in FIG. 2A) described with reference to FIG. 2A.

Hereinafter, a modified example of the method of forming a semiconductor device according to example embodiments will be described with reference to FIGS. 15A and 15B.

Figure 12A:
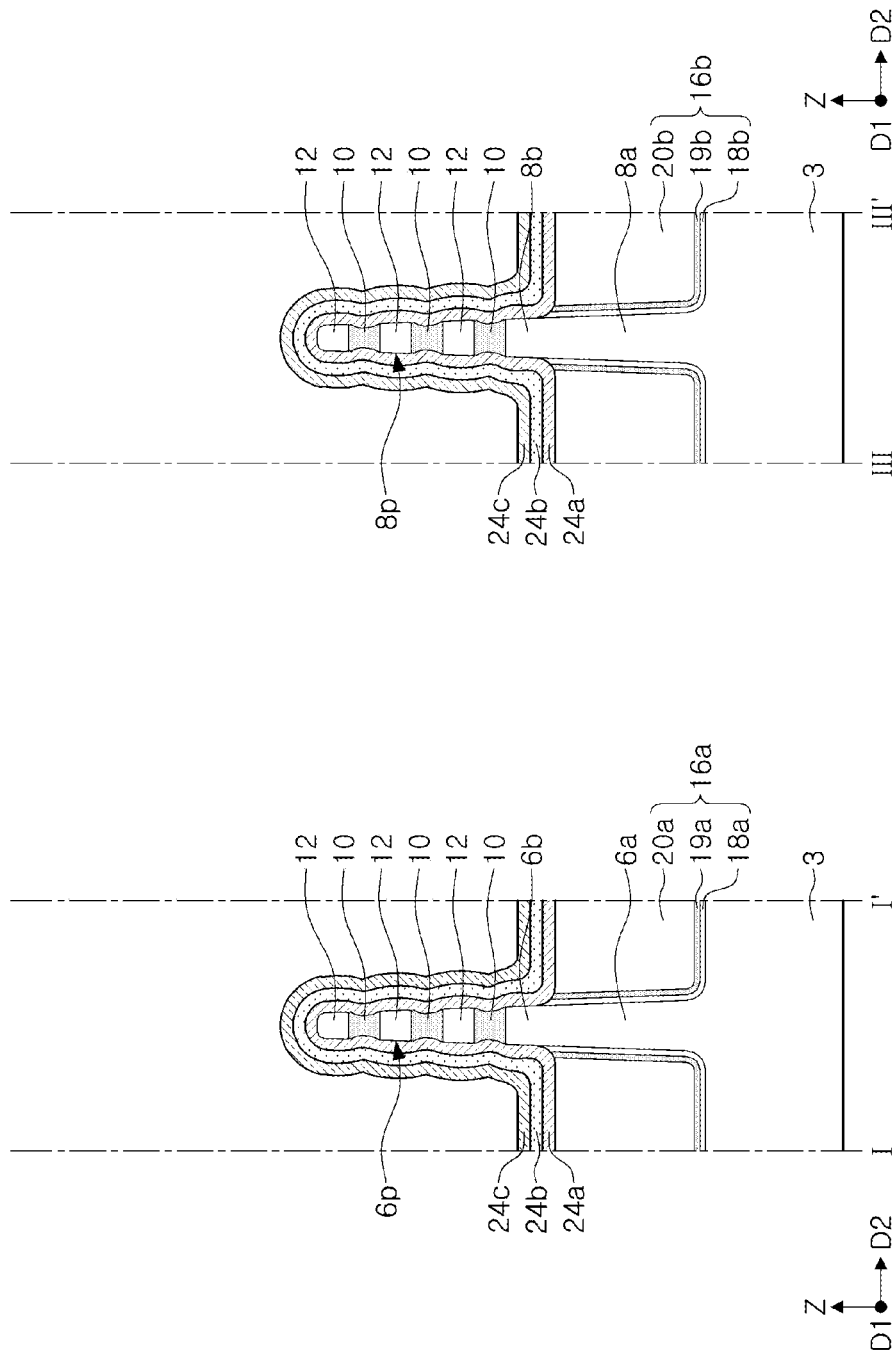
FIGS. 12A to 14B illustrate cross-sectional views of stages in a method of forming a semiconductor device according to example embodiments.
Figure 12B:
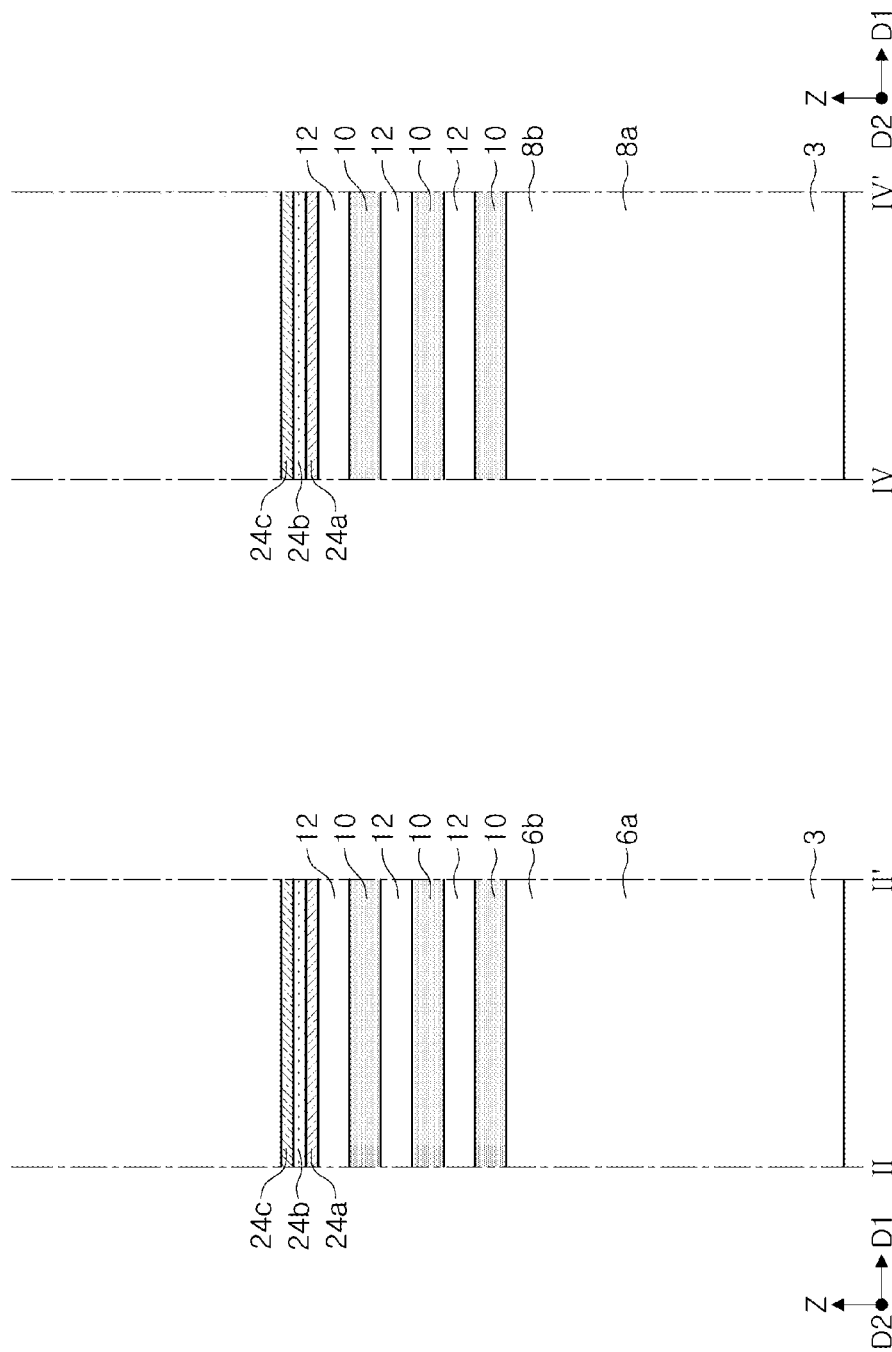
Figure 15A:
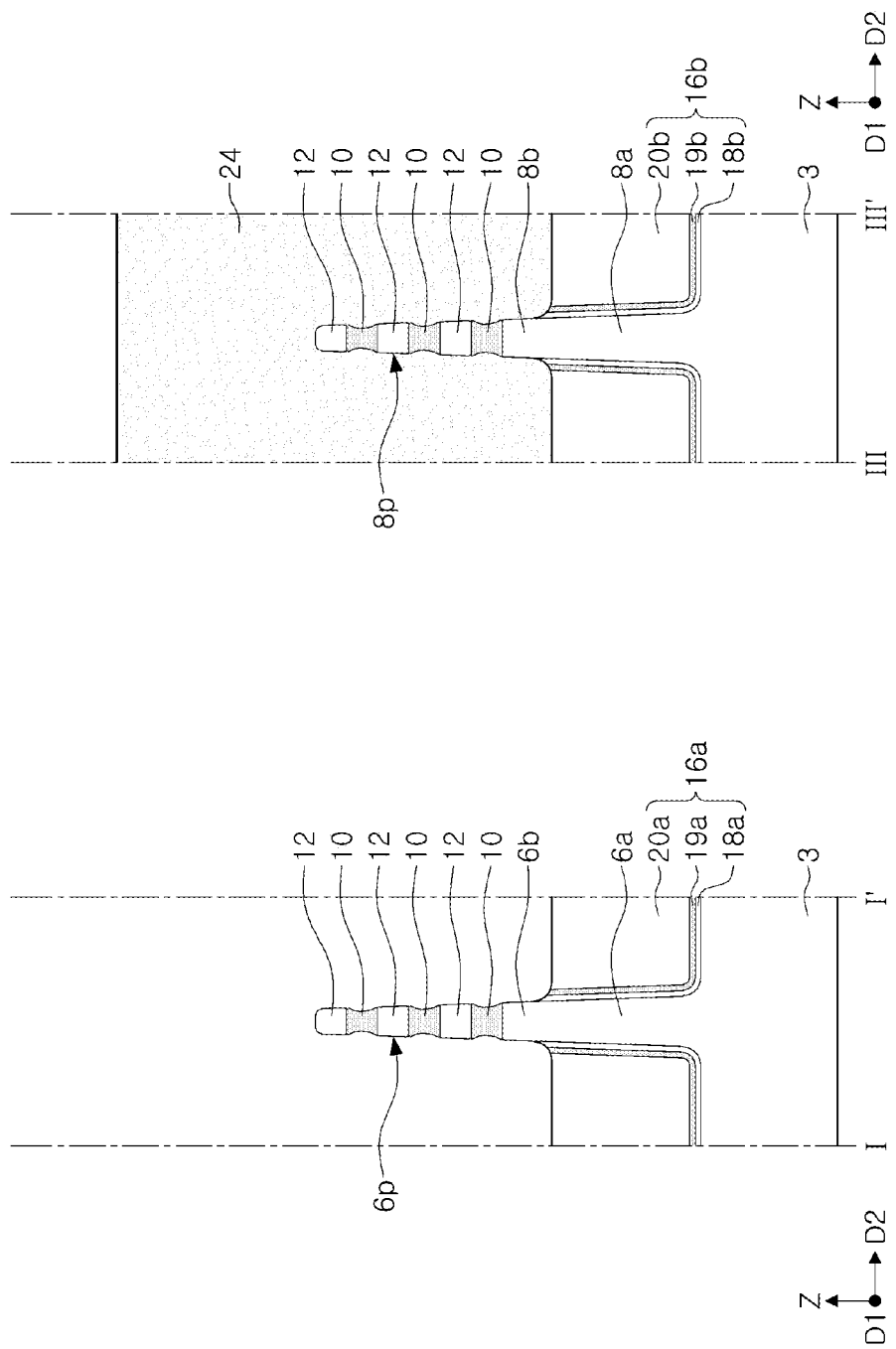
FIGS. 15A and 15B illustrate cross-sectional views of stages in another example of a method of forming a semiconductor device according to example embodiments.
Figure 15B:
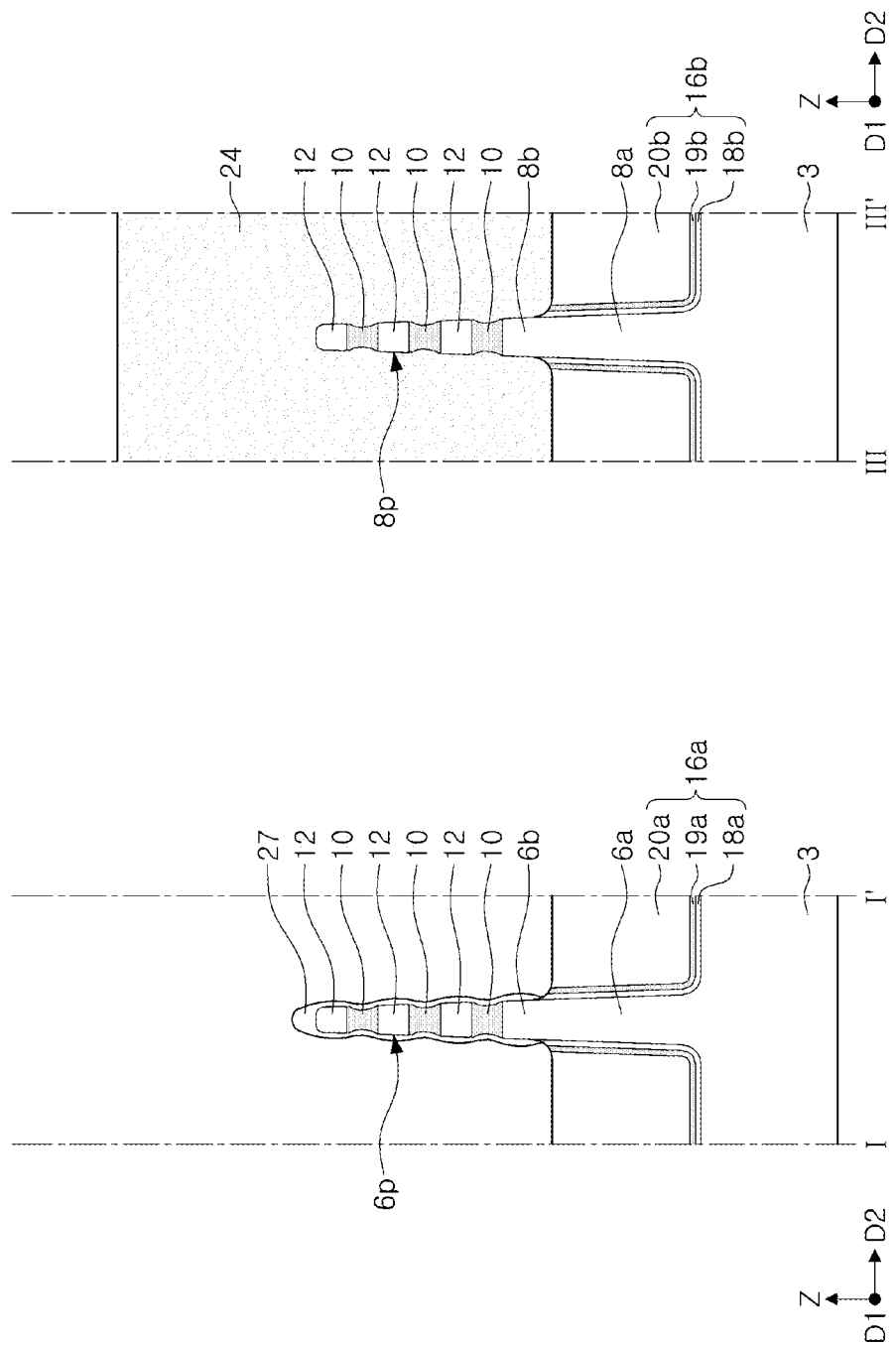

In a modified example, referring to FIGS. 15A and 15B, the same first and second fin structures as described in FIGS. 12A and 12B may be formed. Similarly, as described in FIGS. 12A and 12B, the first fin structure may have a first fin protrusion region 6P protruding from the first isolation layer 16a, and the second fin structure may have the second fin protrusion region 8P protruding from the second isolation layer 16b.

A sacrificial protective layer 24 may be formed to cover the second fin protrusion region 8P of the second fin structure. A semiconductor capping layer 27, epitaxially grown from a surface of the first fin protrusion region 6P, may be formed while protecting the second fin protrusion region 8P of the second fin structure from an epitaxial growth process with the second sacrificial protective layer 24b. Then, the sacrificial protective layer 24 may be selectively removed. Thus, the same structure as described in FIG. 14A may be formed.

Referring to FIGS. 1, 2A, 2B, and 11, a gate and source/drain process may be performed (S50). The gate and source/drain process may be performed to form the first and second gate structures 45a and 45b and the first and second source/drain regions 40a and 40b, as described in FIGS. 2A and 2B.

Forming the first gate structure 45a and the source/drain regions 40a may include forming the first material layer 47a_1 and a first sacrificial gate structure, sequentially stacked, across the first fin protrusion region (6P in FIGS. 14A and 14B) and the semiconductor capping layer (27 in FIGS. 14A and 14B), forming a first gate spacer 56a on a side surface of the first sacrificial gate structure, etching the first fin protrusion region (6P in FIGS. 14A and 14B) and the semiconductor capping layer (27 in FIGS. 14A and 14B) on opposite sides adjacent to the first sacrificial gate structure to form a fin structure 33 as described in FIG. 2A, forming the first source/drain regions 40a on opposite sides adjacent to the fin structure 33, removing the first sacrificial gate structure to form a first gate trench, sequentially forming a second material layer 47a2 and a first gate electrode 49a in the first gate trench as described in FIG. 2A, and forming a gate capping layer 53a on the first gate electrode 49a as described in FIG. 2A. Then, first contact plugs 62a may be formed to penetrate through the first insulating layer 59a.

Forming the second gate structure 45b and the second source/drain regions 40b may include forming a first material layer and a second sacrificial gate structure, sequentially stacked, across the second fin protrusion region (8P in FIGS. 14A and 14B), forming a second gate spacer 56b on a side surface of the second sacrificial gate structure, etching the second fin protrusion region (8P in FIG. 14B) on opposite sides adjacent to the second sacrificial gate structure such that recesses are formed to expose the plurality of silicon-germanium layers (10 in FIGS. 14A and 14B) and the plurality of silicon layers (12 in FIGS. 14A and 14B) of the second fin protrusion region (8P in FIGS. 14A and 14B), forming second source/drain regions 40b to fill the recesses, forming the second source/drain regions 40b, forming a second insulating layer 59b on the second source/drain regions 40b, removing the first material layer and the second sacrificial gate structure such that a second gate trench is formed to expose side surfaces of the plurality of silicon-germanium layers (10 in FIGS. 14A and 14B) of the second fin protrusion region (8P in FIGS. 14A and 14B), selectively removing the plurality of silicon-germanium layers (10 in FIGS. 14A and 14B) of the second fin protrusion region (8P in FIGS. 14A and 14B) exposed by the second gate trench, sequentially forming a third material layer 41b_1, a fourth material layer 47b_2, and a second gate electrode 49b, as described in FIG. 2B, in the gate trench and a space in which the plurality of silicon-germanium layers (10 in FIGS. 14A and 14B), and forming a gate capping layer 53b, as described in FIG. 2B, on the second gate electrode 49b.

Then, second contact plugs 62b may be formed to penetrate through the second insulating layer 53b.

By way of summation and review, example embodiments provide a semiconductor device, capable of improving electrical characteristics. That is, as described above, according to example embodiments, a semiconductor device having a channel structure having improved electrical characteristics may be provided.

In other words, according to example embodiments, a semiconductor device may include an epitaxially grown, e.g., silicon, semiconductor capping layer on a surface of a fin structure that includes alternating, e.g., Si/SiGe, semiconductor layers, so the semiconductor capping layer separates the alternating semiconductor layers from a gate electrode thereon. As such, the alternating semiconductor layers provide a channel of a high-voltage transistor, while the semiconductor capping layer is between the alternating semiconductor layers and a gate dielectric substance of a high-voltage transistor. Thus, the semiconductor capping layer prevents direct contact between the gate dielectric substance of the high-voltage transistor and the alternating semiconductor layers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first active region extending from a semiconductor substrate in a vertical direction, the first active region extending in a first direction, parallel to an upper surface of the semiconductor substrate;
   first source/drain regions spaced apart from each other in the first direction on the first active region;
   a fin structure between the first source/drain regions on the first active region, the fin structure including:
      a first lower semiconductor region extending from the first active region,
      a stack structure on the first lower semiconductor region, the stack structure including alternating first and second semiconductor layers stacked in the vertical direction, and a side surface of at least one first semiconductor layer of the alternating first and second semiconductor layers being recessed in a second direction perpendicular to the first direction, and
      a semiconductor capping layer on the stack structure;
   a first isolation layer covering a side surface of the first active region on the semiconductor substrate;
   a first gate structure overlapping the fin structure and extending in the second direction to cover an upper surface of the fin structure and side surfaces of the fin structure in the second direction, the semiconductor capping layer being between the first gate structure and the stack structure and between the first gate structure and the first lower semiconductor region; and
   first contact plugs electrically connected to the first source/drain regions.

2. The semiconductor device as claimed in claim 1, wherein, among the side surfaces of the fin structure in the second direction, at least one side surface of the fin structure protrudes in the second direction to overlap a portion of the first isolation layer.

3. The semiconductor device as claimed in claim 2, wherein the alternating first and second semiconductor layers do not overlap the first isolation layer.

4. The semiconductor device as claimed in claim 2, wherein a portion of the semiconductor capping layer that covers the first lower semiconductor region also overlaps a portion of the first isolation layer.

5. The semiconductor device as claimed in claim 1, wherein the semiconductor capping layer includes:
   a first portion on an upper surface of an uppermost second semiconductor layer of the alternating first and second semiconductor layers; and
   second portions contacting the first semiconductor layers, a thickness of the first portion in the vertical direction being greater than or equal to twice a thickness of at least one of the second portions in the second direction.

6. The semiconductor device as claimed in claim 1, wherein:
   the first gate structure includes:
      a gate dielectric layer, the gate dielectric layer being in contact with an upper surface of the first isolation layer, side surfaces of the fin structure in the second direction, and the upper surface of the fin structure; and
      a gate electrode on the gate dielectric layer, and
   the gate dielectric layer has a thickness greater than a thickness of the semiconductor capping layer.

7. The semiconductor device as claimed in claim 1, wherein:
   the first isolation layer includes a buffer insulating layer covering a side surface of the first active region, an insulating liner covering the buffer insulating layer, and a gap-fill insulating layer covering the insulating liner, and
   among side surfaces of the fin structure in the second direction, at least one side surface protrudes in the second direction to overlap an upper end of the buffer insulating layer, but not to overlap an upper surface of the gap-fill insulating layer.

8. The semiconductor device as claimed in claim 1, wherein:
   each first semiconductor layer of the alternating first and second semiconductor layers is formed of silicon-germanium,
   each of second semiconductor layer of the alternating first and second semiconductor layers is formed of silicon,
   among the alternating first and second semiconductor layers, a lowermost layer is a lowermost first semiconductor layer and an uppermost layer is an uppermost first semiconductor layer, and
   each first semiconductor layer of the alternating first and second semiconductor layers has a thickness greater than a thickness of the semiconductor capping layer.

9. The semiconductor device as claimed in claim 1, wherein:
   among the alternating first and second semiconductor layers, a lowermost layer is a lowermost first semiconductor layer,
   the first lower semiconductor region is at a level higher than a level of the first isolation layer, the first lower semiconductor region has a thickness greater than a thickness of the lowermost first semiconductor layer, and the first lower semiconductor region has a thickness greater than a thickness of a lowermost second semiconductor layer among the second semiconductor layers of the alternating first and second semiconductor layers.

10. The semiconductor device as claimed in claim 1, wherein:

among the alternating first and second semiconductor layers, a lowermost layer is a lowermost first semiconductor layer, and in the alternating first and second semiconductor layers, a portion of the semiconductor capping layer covering a side surface of the first lower semiconductor region has a maximum thickness different from a maximum thickness of a portion of the semiconductor capping layer covering a side surface of the lowermost first semiconductor layer.

11. The semiconductor device as claimed in claim 1, wherein:

among the alternating first and second semiconductor layers, an uppermost layer is an uppermost second semiconductor layer, among the first semiconductor layers of the alternating first and second semiconductor layers, an uppermost first semiconductor layer is in contact with the uppermost second semiconductor layer and is below the uppermost second semiconductor layer, and the fin structure, disposed at a level higher than a level of the uppermost first semiconductor layer, has a rounded portion.

12. The semiconductor device as claimed in claim 1, wherein:

among the alternating first and second semiconductor layers, an uppermost layer is an uppermost second semiconductor layer, and among the second semiconductor layers of the alternating first and second semiconductor layers, the uppermost second semiconductor layer has a thickness different from a thickness of each of the other second semiconductor layers.

13. The semiconductor device as claimed in claim 1, wherein:

among the alternating first and second semiconductor layers, an uppermost layer is an uppermost first semiconductor layer and a lowermost layer is a lowermost first semiconductor layer, each first semiconductor layer of the alternating first and second semiconductor layers is a silicon layer, and each second semiconductor layer of the alternating first and second semiconductor layers is a silicon-germanium layer.

14. The semiconductor device as claimed in claim 1, further comprising:

a second active region protruding from the semiconductor substrate in the vertical direction and extending in the first direction;

a second lower semiconductor region extending from the second active region in the vertical direction;

semiconductor channel layers spaced apart from each other in the vertical direction on the second lower semiconductor region;

a second isolation layer covering a side surface of the second active region;

a second gate structure extending in the second direction on the second isolation layer to surround the semiconductor channel layers;

second source/drain regions extending in the vertical direction on the second active region to be connected to side surfaces of the semiconductor channel layers in the first direction; and second contact plugs electrically connected to the second source/drain regions, wherein the first gate structure includes a first gate dielectric layer and a first gate electrode on the first gate dielectric layer, the second gate structure includes a second gate dielectric layer and a second gate electrode on the second gate dielectric layer, and the first gate dielectric layer has a thickness greater than a thickness of the second gate dielectric layer.

* * * * *